US006441829B1

(12) United States Patent
Blalock et al.

(10) Patent No.: US 6,441,829 B1
(45) Date of Patent: Aug. 27, 2002

(54) PIXEL DRIVER THAT GENERATES, IN RESPONSE TO A DIGITAL INPUT VALUE, A PIXEL DRIVE SIGNAL HAVING A DUTY CYCLE THAT DETERMINES THE APPARENT BRIGHTNESS OF THE PIXEL

(75) Inventors: Travis N. Blalock, Charlottesville, VA (US); Ken Nishimura, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/409,236

(22) Filed: Nov. 18, 1999

(51) Int. Cl.[7] .......................... G09G 5/00; G09G 3/36; H03M 1/00

(52) U.S. Cl. ......................... 345/690; 345/99; 345/100; 341/141

(58) Field of Search ............................ 345/97, 99, 100, 345/204, 214, 690, 88; 341/141, 142, 144, 155

(56) References Cited

U.S. PATENT DOCUMENTS 4,232,311 A * 11/1980 Agneta ....................... 340/703
4,484,187 A * 11/1984 Brown et al. ............... 340/703
4,710,806 A * 12/1987 Iwai et al. .................... 358/81
5,977,940 A * 11/1999 Akiyama et al. ............. 345/94
6,169,505 B1 * 1/2001 Nishimura et al. ......... 341/141
6,249,269 B1 * 6/2001 Blalock et al. ............... 345/97

FOREIGN PATENT DOCUMENTS

EP 0953959 A2 11/1999 ............ G09G/3/34
EP 0953960 A1 11/1999 ............ G09G/3/16

* cited by examiner

*Primary Examiner*—Bipin Shalwala
*Assistant Examiner*—Jeff Piziali
(74) *Attorney, Agent, or Firm*—Ian Hardcastle

(57) ABSTRACT

A digital pixel driver that operates in response to an M-bit digital input value defining the apparent brightness of the pixel. The pixel driver generates a pixel drive signal having a duty cycle that sets the apparent brightness of the pixel. The pixel driver comprises a memory, a digital sequence generator and a comparator. The memory receives and stores an N-bit word that represents the digital input value. The digital sequence generator generates a digital sequence of P-bit digital values that defines the temporal duration of the pixel drive signal and includes a first P-bit word that represents at least part of the digital input value at a location temporally corresponding to the duty cycle of the pixel drive signal as defined by the at least part of the digital input value. The comparator is connected to receive the digital sequence from the digital sequence generator and a second P-bit word from the memory. The second P-bit word constitutes at least part of the N-bit word. The comparator includes an output that provides the pixel drive signal and that changes state in response to correspondence between the first P-bit word and the second P-bit word.

28 Claims, 19 Drawing Sheets

| CODE | RED COMPONENT VALUE | GREEN COMPONENT VALUE | BLUE COMPONENT VALUE |
|---|---|---|---|
| 0 | RESERVED | | |
| 1 | 15 | 3 | 7 |
| 2 | 4 | 12 | 7 |
| 3 | 12 | 5 | 14 |

| CODE | GREY-SCALE VALUE |
|---|---|
| 0 | RESERVED |
| 1 | 4 |
| 2 | 1 |
| 3 | 12 |

| CODE | BLUE COMPONENT VALUE |
|---|---|
| 0 | RESERVED |
| 1 | 7 |
| 2 | 7* |
| 3 | 14 |

PIXEL DRIVER THAT GENERATES, IN RESPONSE TO A DIGITAL INPUT VALUE, A PIXEL DRIVE SIGNAL HAVING A DUTY CYCLE THAT DETERMINES THE APPARENT BRIGHTNESS OF THE PIXEL

FIELD OF THE INVENTION

The invention relates to a circuit and method for driving a pixel with a pixel drive signal whose duty cycle is defined by a digital input value.

BACKGROUND OF THE INVENTION

A substantial need exists for various types of video and graphics display devices with improved performance and lower cost. For example, a need exists for miniature video and graphics display devices that are small enough to be integrated into a helmet or a pair of glasses so that they can be worn by the user. Such wearable display devices would replace or supplement the conventional displays of computers and other devices. In particular, wearable display devices could be used instead of the conventional displays of laptop and other portable computers, and portable Digital Versatile Disk (DVD) players. Potentially, wearable display devices can provide greater brightness, better resolution, larger apparent size, greater privacy, substantially less power consumption and longer battery life than conventional active matrix or double-scan liquid crystal-based displays. Other potential applications of wearable display devices are in personal video monitors, in video games and in virtual reality systems.

Recently, a miniature video display based on a light valve that uses a ferroelectric liquid crystal material was described in U.S. patent applications Ser. Nos. 09/070,487 and 09/070,669, assigned to the assignee of this disclosure and incorporated herein by reference. Such a miniature video display can form part of a wearable eyeglass display that can be used to display computer graphics when connected to the video output of a computer, especially a laptop computer, and can be used to display video when connected to the video output of a TV receiver, a video cassette player or a DVD player, especially a portable DVD player.

One embodiment of the light valve of such a miniature video display includes an array of 1024×768 pixels, each including a reflective electrode driven by a respective pixel driver. The pixel driver converts an analog sample derived from an analog video signal into a two-state drive signal having a duty cycle that defines the apparent brightness of the pixel. Sequentially illuminating with light of two or more different colors and setting each pixel to an apparent brightness associated with each color during the respective illumination period enables a color frame to be displayed. A similar pixel driver can be used in video displays based on other binary electro-optical transducers, such as solid-state or organic light-emitting materials, in which duty cycle of the drive signal coupled to the electro-optical transducer determines the apparent brightness of the pixel.

When the miniature video display just described is driven by a conventional analog video signal, analog samples are derived from each line of the analog video signal and are distributed via column busses to the pixel circuits in each row of the array. Recently, however, it has been proposed to use the video display just described as the viewfinder of a digital camera that generates a digital video signal. Moreover, many other video applications generate a digital video signal composed of parallel red, green and blue pixel values. To drive the above-mentioned analog video display, a digital-to-analog converter must be used to convert the digital video signal generated by the camera to an analog signal. A parallel digital-to-analog converter suitable for this purpose is described in U.S. patent application Ser. No. 09/249,600, assigned to the assignee of this application.

Using a digital-to-analog converter to convert the digital video signal to an analog signal suitable for driving the above-described analog-based miniature video display requires considerable additional circuitry and increases the power consumption of the display. Power consumption is an important consideration since the miniature video display is especially intended for use as the display for laptop computers and portable DVD players. Moreover, the analog circuitry of the miniature video display presents significant challenges when the highest picture quality is desired. Another important shortcoming is that new analog samples must be obtained from the video signal and be distributed to the pixels constituting the display after each display period, which is typically one video frame period. When the frame being displayed is relatively static, as in a computer display or the display of an electronic book, this needlessly increases the power consumption.

Miniature video displays that incorporate liquid crystal-based light valves and are indirectly driven by a digital video signal are known. In these, the digital video signal is converted into a grey scale binary-weighted, time-multiplexed, time domain binary-weighted drive signal to drive each pixel. The time domain weighting of the drive signal creates tremendous inefficiencies in the link between the converter and the display since the link is idle during the ON time of the high order bits. Including an image buffer in the display removes this inefficiency, but significantly increases the cost and power consumption of the display. The bitwise binary-weighted time domain drive signal also imposes a significant burden on the bandwidth of the liquid crystal material itself due to the switching speed necessary to display the low-order bits, which have a very short duration. Current ferroelectric liquid crystal materials do not have sufficient switching speed to display a full 24-bit (eight bits per color) color palette. This problem is further exacerbated by the desire to move process technology to lower and lower voltages, since the switching speed of ferroelectric liquid crystal material depends on the strength of the applied field, and therefore on the voltage of the drive signal.

An additional complexity is the bit reordering that must be applied to the digital video signal. Most digital video signals are composed of sets of RGB pixel values in raster scan order. Bitwise imaging requires buffering of the RGB pixel values and then reordering them into a bit-plane sequential data stream in which the lowest-order bits (for example) of all the pixels are presented first, followed by the next-but-lowest order bits of all the pixels, and so on until the highest-order bits of all the pixels are presented. Re-ordering the digital video signal requires a buffer memory that has significant bandwidth requirements, and power consumption, when the display has a high resolution.

Accordingly, what is needed is a pixel driver capable of directly receiving a pixel value constituting part of a conventional digital video signal and of generating, in response to the pixel value, a drive signal having a duty cycle that, in a monochrome display, determines the apparent brightness of the pixel and, in a color display, determines the apparent brightness of the pixel for each of two or more color components. The pixel driver should be simple, so that the pixel can be made sufficiently small to allow a high-resolution display composed of hundreds of thousands, or even millions, of pixels to be formed on a semiconductor chip having dimensions of the order of 10 mm×10 mm. The pixel driver should have low power consumption to enable it to be used in portable, battery-powered applications. Finally, when the digital video signal is relatively static, the pixel driver should be capable of operating in a mode that does not require the pixel values to be re-loaded into the pixels after each display period to reduce power consumption.

SUMMARY OF THE INVENTION

The invention provides a digital pixel driver that operates in response to an M-bit digital input value defining the apparent brightness of the pixel. The pixel driver generates a pixel drive signal having a duty cycle that sets the apparent brightness of the pixel. The pixel driver comprises a memory, a digital sequence generator and a comparator. The memory receives and stores an N-bit word that represents the digital input value. The digital sequence generator generates a digital sequence of P-bit digital values that defines the temporal duration of the pixel drive signal and includes a first P-bit word that represents at least part of the digital input value at a location temporally corresponding to the duty cycle of the pixel drive signal as defined by the at least part of the digital input value. The comparator is connected to receive the digital sequence from the digital sequence generator and a second P-bit word from the memory. The second P-bit word constitutes at least part of the N-bit word. The comparator includes an output that provides the pixel drive signal and that changes state in response to correspondence between the first P-bit word and the second P-bit word.

The invention also provides a method for generating a pixel drive signal in response to an M-bit digital input value defining the apparent brightness of the pixel. The pixel drive signal has a duty cycle that sets the apparent brightness of the pixel. In the method, an N-bit word representing the digital input value is received and stored. A digital sequence composed of P-bit digital values is generated. The digital sequence defines the temporal duration of the pixel drive signal, and includes a first P-bit word that represents at least part of the digital input value at a location temporally corresponding to the duty cycle of the pixel drive signal as defined by the at least part of the digital input value. A second P-bit word constituting at least part of the stored N-bit word is compared with the digital sequence to generate the pixel drive signal. The pixel drive signal changes state in response to correspondence between the second P-bit word and the first P-bit word.

The different embodiments of the pixel driver and pixel drive signal generating method according to the invention are capable of driving an electrode applied to an electro-optical element to set the pixel to an apparent brightness in a monochrome display element and to set the pixel to an apparent brightness for each of two or more color components in a color display element. In the monochrome display element, the M-bit digital input value defines the apparent brightness of the pixel. In the color display element, the M-bit digital input value defines the apparent brightness of the pixel for the two or more color components, and the portions of the M-bit digital input value that define the apparent brightness for each of the color components may be received sequentially or simultaneously.

The pixel driver and pixel drive signal generating method according to the invention are also capable of driving an electrode applied to an electro-optical element to set the pixel to an apparent brightness in a monochrome display element and to set the pixel to an apparent brightness for each of two or more color components in a color display element in response to an N-bit palette code that represents the M-bit digital input value. The N-bit palette code is generated in response to the M-bit digital input value and identifies an element of a palette to represent the digital input value. The palette is composed of elements constituting a subset of a range of apparent brightnesses defined by digital input values having M bits. The palette is defined by a palette code table in which each of the elements is represented by an N-bit palette code and is defined by an M-bit value. In different embodiments of the pixel driver and the pixel drive signal generating method according to the invention, the N-bit palette code represents the apparent brightness of the pixel in the monochrome display element. In the color display element, the N-bit palette code may represent the apparent brightness of the pixel for one color component or may represent the apparent brightness of the pixel for each of two or more color components.

When the digital input value is represented by an N -bit palette code, the N-bit palette code is received and stored as the an N-bit word representing the digital input value, and the digital sequence is generated in response to the palette code table. The digital sequence includes the N-bit palette code for each of the elements of the palette at the location temporally corresponding to the duty cycle of the pixel drive signal defined by the M-bit value of the element.

The portion of the digital pixel driver according to the invention located in the pixel is simple and therefore enables the pixel to be small in size. This permits the pixel driver according to the invention to be incorporated into high-density display element. The portion of the pixel driver according to the invention located in the pixel is even simpler and smaller when the digital input value is represented by an N-bit palette code. This allows the pixel density to be further increased.

The digital pixel driver and the pixel drive signal generating method according to the invention generate a pixel drive signal having only one change of state per display period. This is in contrast to the above-mentioned conventional digital pixel drivers that generate bitwise time domain binary weighted sequences having many changes of state per display period. The pixel drive signals generated by the pixel driver and pixel drive signal generating method according to the invention therefore provide the same advantages in terms of the ferroelectric liquid crystal material bandwidth, buffer organization and link efficiency as the analog pixel drivers referred to above, but provide the additional advantage of operating directly in response to a digital input value.

When the pixel driver and pixel drive signal generating method set the apparent brightness of the pixel in a monochrome display, or set the apparent brightness of the pixel for each of two or more color components in response to all M bits of the digital input value, the pixel driver and pixel drive signal have the additional advantage of being able to operate in a low-power mode in which a new digital input value is received only when the digital input value changes.

DETAILED DESCRIPTION OF THE INVENTION

Figure 1:
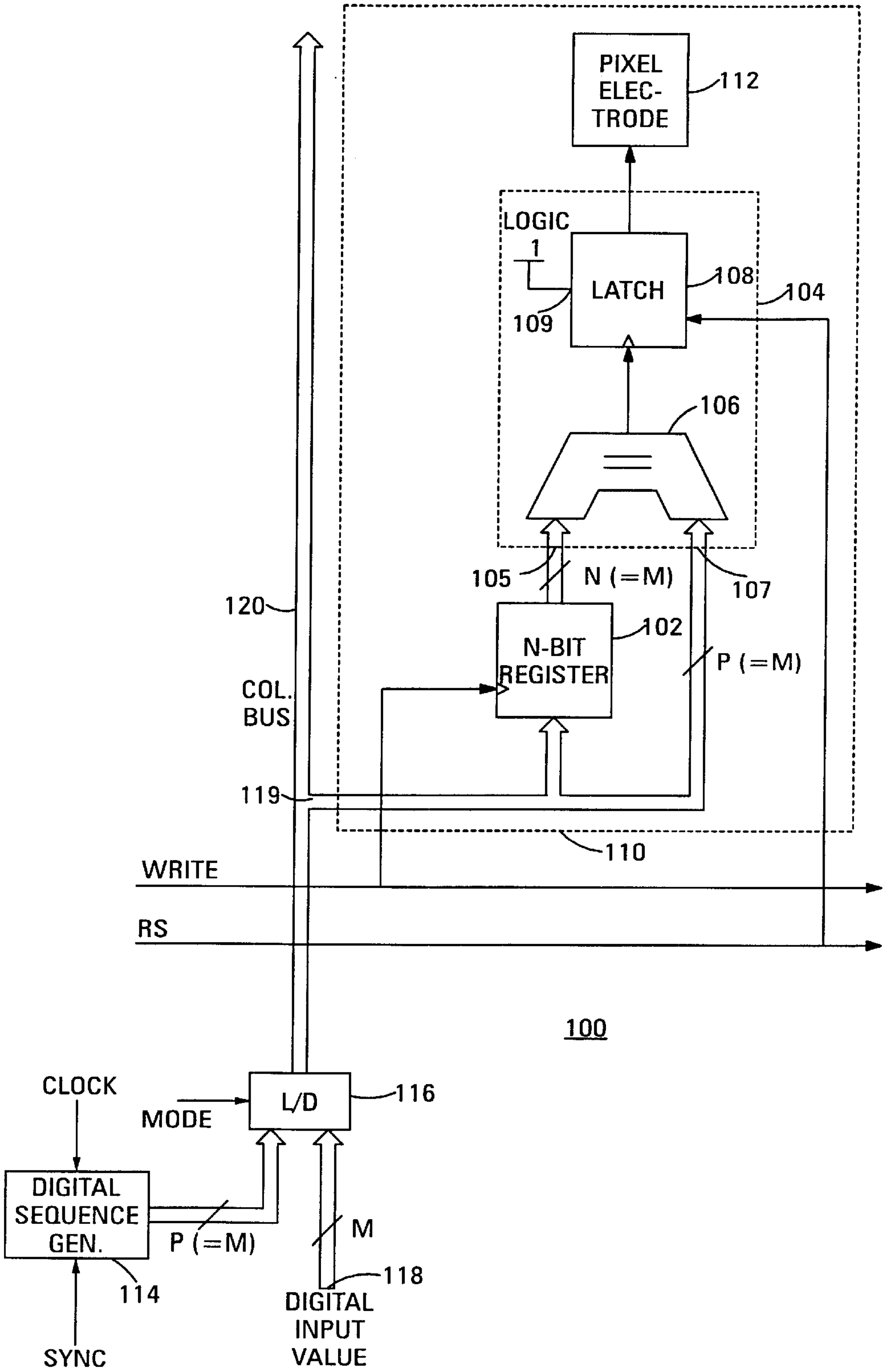
FIG. 1 is a block diagram of a first embodiment of a digital pixel driver according to the invention.

FIG. 1 shows a first embodiment 100 of a digital pixel driver according to the invention. The digital pixel driver 100 can be used instead of the analog pixel drive circuits in the display element of a miniature video display based on a ferroelectric liquid-crystal material such as that described in the above-mentioned U.S. patent applications Ser. Nos. 09/070,487 and 09/070,669. The pixel driver can also be used in other types of pixellated video display in which the apparent brightness of the pixel is determined by the duty cycle of the pixel drive signal generated by the pixel driver. A highly-simplified example of a display element incorporating a number of the digital pixel drivers shown in FIG. 1 will be described below with reference to FIGS. 3A and 3B.

The first embodiment 100 of the digital pixel driver is for use in a monochrome display element and operates in response to an M-bit digital input value that constitutes the portion of a digital video signal that represents one pixel. The pixel driver provides an apparent brightness resolution corresponding to the apparent brightness resolution defined by the digital video signal. The first embodiment may also be used as part of a color display element, as will be described below with reference to FIGS. 4A–4P.

The pixel driver 100 generates a pixel drive signal having a temporal duration. The pixel drive signal is initially in a first state and changes to a second state. The duty cycle of the pixel drive signal is the fraction of the temporal duration in which the pixel drive signal is in its first state. The duty cycle of the pixel drive signal is defined by the M-bit digital input value, which has one of $2^M$ possible states. In this embodiment, the pixel drive signal has one of $2^M$ discrete duty cycles, i.e., the duty cycle corresponds to the M-bit digital input value.

The pixel drive signal is applied to an electro-optical transducer in the pixel. The first state of the pixel drive signal applied to the electro-optical transducer sets the pixel to its ON state, in which it is bright, whereas the second state sets the pixel to its OFF state in which it is dark. When the duration of the pixel drive signal is short compared with the integration time of the human vision system, the eye integrates the bright and dark states of the pixel so that the apparent brightness of the pixel can be determined by the duty cycle of the pixel drive signal. A pixel drive signal having one of $2^M$ discrete duty cycles is capable of setting the apparent brightness of the pixel to a corresponding one of $2^M$ discrete levels of brightness. For example, if M=4, the digital input value can have one of 16 possible values ranging from 0 to 15 and the pixel drive signal can have one of 16 possible duty cycles that range from 0/16 to 15/16 of its temporal duration. Such a pixel drive signal is capable of setting the apparent brightness of the pixel to one of 16 discrete levels of brightness ranging from 0/16 to 15/16 of its maximum brightness.

In the pixel driver, the duty cycle defined by a given digital input value is that which is proportional to the digital input value. For example, if M=4, as exemplified above, a digital input value of seven defines a pixel drive signal having a duty cycle of 7/16 of the temporal duration of the signal. This sets the apparent brightness of the pixel to 7/16 of its maximum brightness.

The digital pixel driver 100 is composed of the N-bit register 102 and the comparator 104. In the example shown, the comparator 104 is composed of the digital comparator 106 and the latch 108, but other suitable comparator circuits can be used. The output of the digital comparator is connected to the clock input of the latch. In this embodiment, the N-bit register is capable of storing all M bits of the digital input value, i.e., N≧M in this embodiment.

Figure 3A:
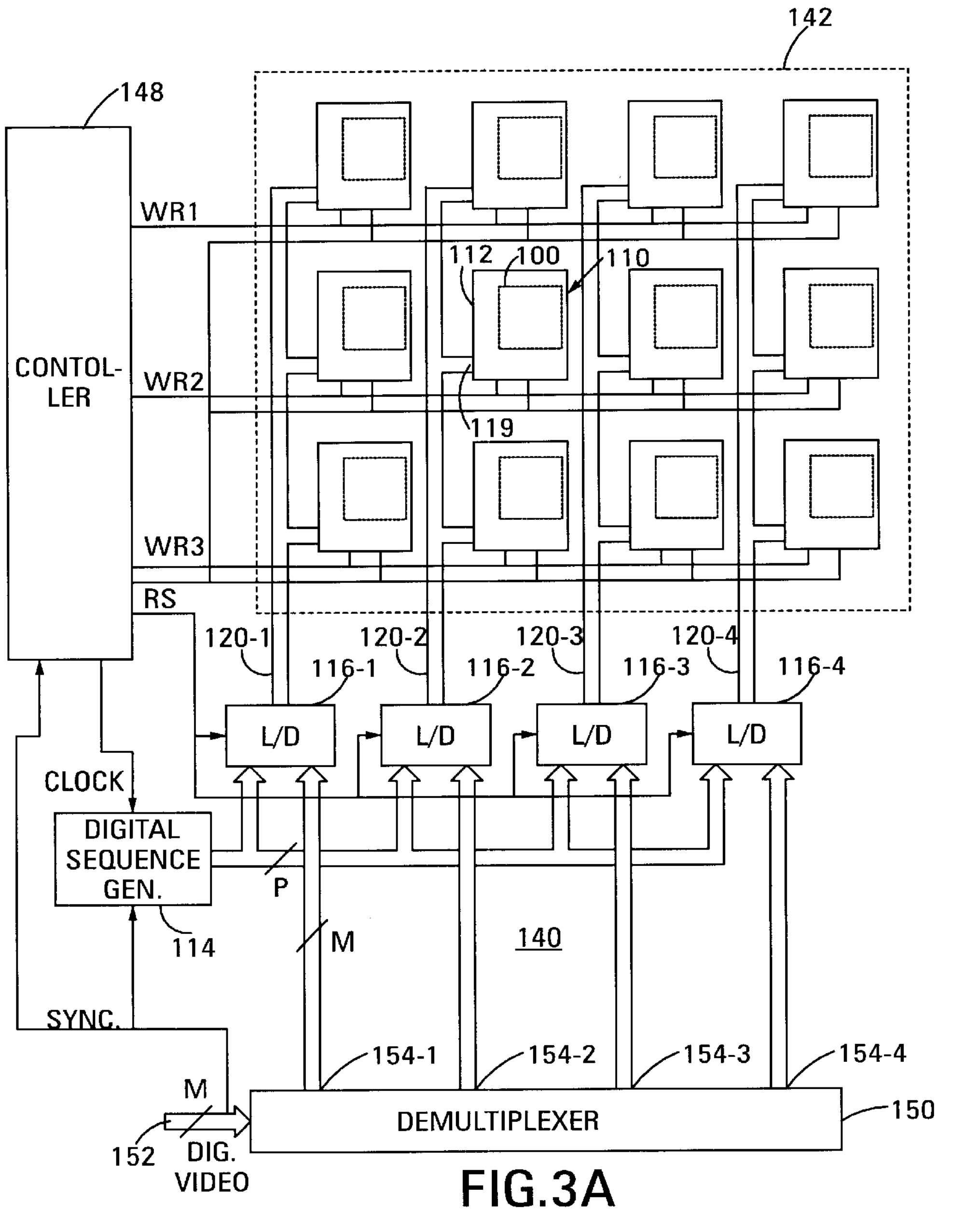
FIG. 3A is a block diagram of a display element that includes a highly-simplified array 4×3 pixels each incorporating the first embodiment of the digital pixel driver according to the invention.

The N-bit register 102 and the comparator 104 are resident in the pixel 110. Also resident in the pixel is the pixel electrode 112 to which the output of the comparator is connected. The comparator applies the pixel drive signal generated by the pixel driver 100 to the pixel electrode. The pixel driver is also shown as including the digital sequence generator 114 and the mode switch 116. However, when the pixel driver 100 is a member of an array of pixel drivers, as is typically the case, the digital sequence generator is common to all of the pixel drivers in the array and the mode switch is common to the pixel drivers in one column of the array, as shown in FIG. 3A.

The digital sequence generator 114 generates a digital sequence composed of P-bit words. In this first embodiment, the words constituting the digital sequence have the same number of bits as the digital input value, i.e., P=M in this embodiment. Also, in this first embodiment, the digital sequence is a monotonically-changing sequence composed of $2^P$ words, the value of which changes, i.e., increases or decreases, monotonically with time, with the initial or final word having a value of zero. As used in this disclosure, the term monotonically-changing sequence encompasses a basic sequence of monotonically-changing digital values in which each cardinal digital value appears in forward or reverse temporal order and additionally encompasses sequences in which the basic sequence has additional digital values interspersed therein. The additional digital values may be single or multiple reserved, “don’t care” or other “junk” digital values, repetitions of digital values appearing earlier or that will appear later in the sequence, or combinations of such digital values.

The temporal duration of the digital sequence is determined by the number of words in the sequence, i.e., the value of M, and the frequency of the clock signal CLOCK. The temporal duration of the pixel drive signal is substantially defined by the temporal duration of the digital sequence. The digital sequence just described, in which the value of the words of the sequence changes monotonically over a time that defines the temporal duration of the pixel drive signal, includes a P-bit word equal to the digital input value at a location temporally corresponding to the duty cycle of the pixel drive signal defined by the digital input value.

The digital sequence generated by the digital sequence generator 114 may be composed of binary words or may alternatively be composed of Gray code words. In the latter case, the digital input value must be a Gray code word, or a binary-to-Gray code converter must be located ahead of the input 118.

One input of the mode switch 116 is connected to the input 118 and receives the digital input value. The digital input value defines the duty cycle of the pixel drive signal that the pixel driver 100 applies to the pixel electrode 112. The other input of the mode switch is connected to the output of the digital sequence generator 114. The mode switch has a control input connected to receive the control signal MODE, which will be described below. The output of the mode switch is connected to the column bus 120 that distributes the output of the mode switch to the data input 119 of the part of the pixel driver 100 resident in the pixel 110. In the pixel, the data input is connected to the input of the N-bit register 102 and to the input 107 of the comparator 104. The output of the N-bit register is connected to the input 105 of the comparator.

The digital pixel driver 100 operates in response to the clock signal CLOCK and the control signals MODE, WRITE and RS generated by the controller 148 to be described below with reference to FIG. 3A. The controller generates these control signal at timings related to the synchronizing signal SYNC included in the digital video signal. The digital pixel driver operates in two temporal periods to generate the pixel drive signal having a duty cycle determined by the digital input value. In the first temporal period, called the load period, the digital input value is transferred from the input 118 to the N-bit register 102, where it is stored. In the second temporal period, called the display period, which follows the load period, the pixel driver generates the pixel drive signal and applies the pixel drive signal to the pixel electrode 112.

Figures 2A, 2B, 2C, 2D, 2E, 2F, 2G, 2H, 2I, 2J, 2K, 2L:
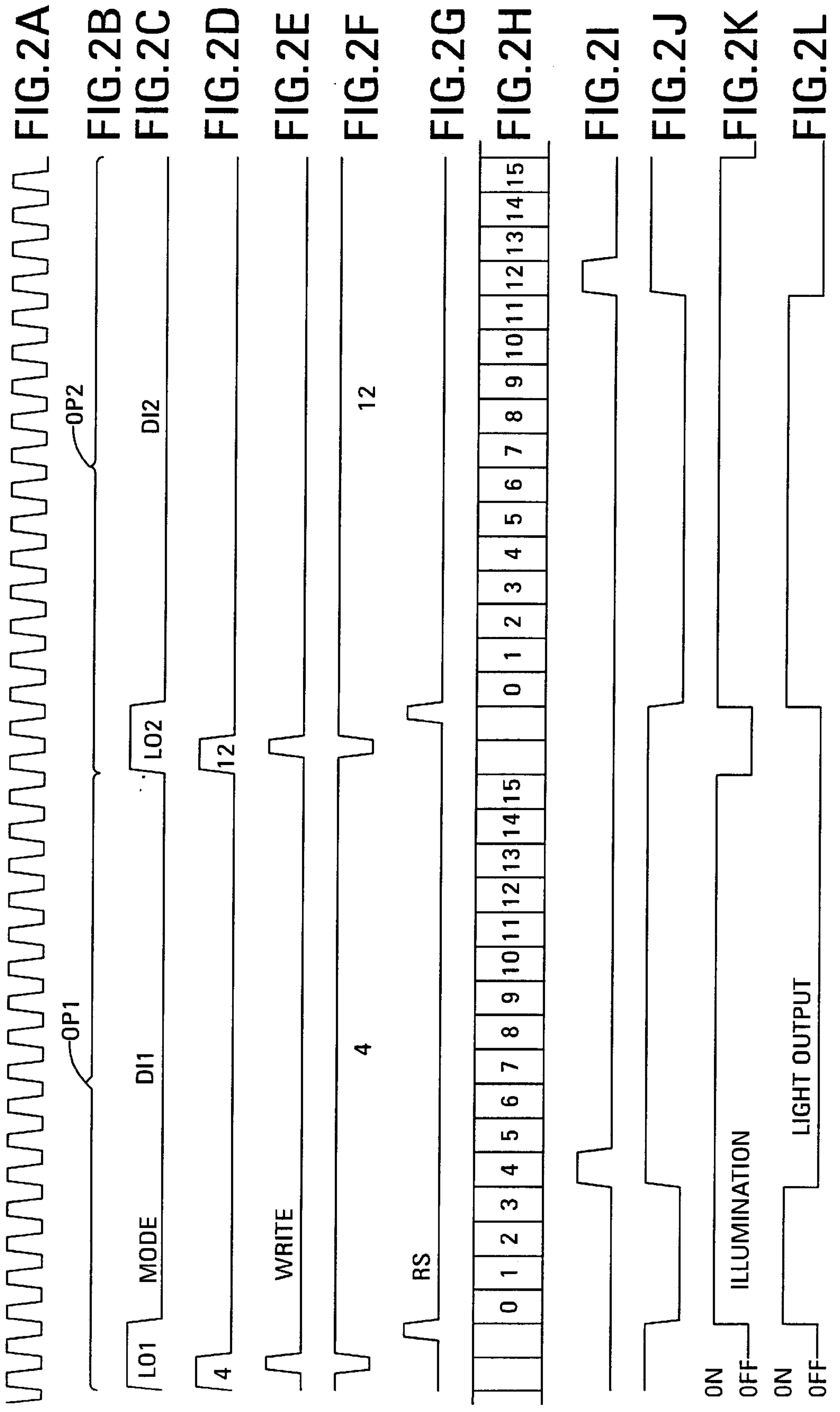
FIGS. 2A–2L illustrate the operation of a display element incorporating the first embodiment of the digital pixel driver in response to two consecutive digital input values to display two consecutive monochrome pictures.

Operation of the digital pixel driver 100 will now be described with reference to FIGS. 1 and 2A–2L. In the example shown, the digital input value received at the input 118 is a 4-bit word, the N-bit register 102 has a capacity of four bits, and the digital sequence generator 114 generates a sequence of 4-bit words. In other words, M=N=P=4. The digital pixel driver operates in response to the clock signal CLOCK shown in FIG. 2A. Operation of the digital pixel driver circuit in the two consecutive operational periods OP1 and OP2 shown in FIG. 2B will be described. FIG. 2C shows the control signal MODE that is in the 1 state during the load period and is in the 0 state during the display period of each operational period. The load period LO1 followed by the display period DI1 constitute the operational period OP1 and the load period LO2 followed by the display period D12 constitute the operational period OP2.

FIG. 2D shows exemplary digital input values received at the input 118. In this disclosure, all binary values are referred to by their decimal equivalents. In the example shown, a digital input value of four is received at the input prior to the end of the load period LO1 and a digital input value of 12 is received at the input prior to the end of the load period LO2. During each load period, the control signal MODE in its 1 state causes the mode switch 116 to connect the input 118 to the column bus 120. This feeds the digital input value from the input 118 to the input of the N-bit register 102.

The control signal WRITE asserted during each load period, as shown in FIG. 2E, writes the digital input value at the input of the N-bit register 102 into the N-bit register. The digital input value thus written into the N-bit register remains stored, and is also present on the output of the N-bit register, until the control signal WRITE is next asserted. The digital input value on the output of the N-bit register, and fed to the input 105 of the comparator 104, is shown in FIG. 2F.

At the end of the load period LO1, the reset control signal RS is asserted, as shown in FIG. 2G. The reset control signal sets the pixel drive signal output by the comparator 104 to its 0 state, as shown in FIG. 2J. The pixel drive signal in its 0 state applied to the pixel electrode 112 sets the pixel 110 to its ON state in which it is bright. The reset control signal sets the output of the latch 108 in the comparator 104 to its 0 state irrespective of the state of the data input 109 of the latch.

Also at the end of the load period LO1, the control signal MODE changes to its 0 state, which indicates the start of the display period DI1. In a display based on a liquid crystal material, the 0 state of the control signal MODE additionally turns the light illuminating the display element ON, as shown in FIG. 2K. The change in state of the control signal MODE also causes the digital sequence generator 114 to begin generating the digital sequence composed of $2^P$ P-bit words, as shown in FIG. 2H. Finally, the change in state of the control signal MODE changes the state of the mode switch 116 to one in which the mode switch connects the output of the digital sequence generator 114 to the column bus 120. This feeds the digital sequence to the input 107 of the comparator 104.

In the display period DI1, each cycle of the clock signal CLOCK causes the P-bit word generated by the digital sequence generator 114 to change, i.e., to increase or decrease, by one least-significant bit from an initial value of zero or $2^P-1$, respectively. In the example shown in FIG. 2H, the P-bit words of the digital sequence increase by one least-significant bit from an initial value of zero. However, this is not critical to the invention. The P-bit words can alternatively decrement by one least-significant bit from a maximum value of $2^P-1$. In a digital sequence in which the P-bit words change by one least-significant bit each clock cycle, the number of clock cycles between the beginning or the end of the display period and a given P-bit word is proportional to the value of the P-bit word. For example, in the display period DI1, the P-bit word equal to the digital input value of four appears in the digital sequence at the end of four clock cycles from the beginning of the display period. A digital input value of four defines a pixel drive signal having a duty cycle of 4/16 of the temporal duration of the signal. Thus, the digital sequence includes a P-bit word equal to the digital input value at a location temporally corresponding to the duty cycle of the pixel drive signal defined by the digital input value.

The comparator 104 compares the digital values on its inputs 105 and 107, i.e., compares the digital input value on the input 105 with the current P-bit word of the digital sequence on the input 107. When the digital values are different, the pixel drive signal output by the comparator remains in its 0 state, as shown in FIG. 2J. When the values correspond, as occurs in this example when the P-bit word of the digital sequence becomes equal to the digital input value of four at the end of the fourth clock cycle of the display period DI1, the pixel drive signal output by the comparator changes to its 1 state, also as shown in FIG. 2J. The pixel drive signal remains in its 1 state for the remainder of the digital sequence. Thus, in the display period DI1, the pixel drive signal is in its 0 state for four of the 16 clock cycles of the digital sequence and is in its 1 state for the remaining 12 of the 16 clock cycles of the digital sequence. The pixel drive signal therefore has a duty cycle of 4/16 of the temporal duration of the signal, corresponding to the digital input value of four.

The 1 state of the pixel drive signal applied to the pixel electrode 112 sets the pixel 110 to its OFF state, as shown in FIG. 2L. In its OFF state, the pixel is dark, even though the pixel is still illuminated, as shown in FIG. 2K.

In the example of the comparator 104 shown, equality between the digital values on the inputs of the digital comparator 106 causes the output of the digital comparator to change to its 1 state as shown in FIG. 2I. The P-bit word of the digital sequence changes at the start of the next clock cycle so that the digital values on the inputs of the digital comparator are no longer equal. This causes the output of the digital comparator to revert to its 0 state, also as shown in FIG. 2I. The output of the digital comparator 106 serves as the clock signal for the latch 108. The change in the output of the digital comparator to its 1 state causes the latch to transfer the state of the data input 109 to the output of the latch. In this embodiment, the data input 109 is held in the logical 1 state, and the clock signal provided by the output of the digital comparator causes the pixel drive signal output by the latch to change to its 1 state, as shown in FIG. 2J. The pixel drive signal output by the latch remains in its 1 state until once more reset by the control signal RS at the beginning of the display period DI2, also as shown in FIG. 2J.

At the end of the display period DI1, the control signal MODE reverts to its 1 state, as shown in FIG. 2C. This extinguishes the light illuminating the display element, as shown in FIG. 2K. The display was illuminated through the display period, but the pixel was in its ON state, in which it was bright, only for the number of periods of the clock signal CLOCK equal to the digital input value, as shown in FIG. 2L. The pixel would have a maximum apparent brightness if the pixel were in its ON state, in which it was bright, throughout the display period. However, in this example, the pixel is in its ON state, and is bright, for four of the 16 clock cycles constituting the display period and is in its OFF state, and is dark, for the 12 clock cycles constituting the remainder of the display period. Thus, the pixel is bright for a fraction 4/16 of the display period, and the apparent brightness of the pixel is 4/16 of the maximum. This is proportional to the digital input value of four.

Operation of the digital pixel driver 100 during the second operational period OP2 is essentially similar to that just described, except that the pixel drive signal output by the comparator 104 does not revert to its 1 state, and change the pixel to its OFF state, until the end of the $2^{th}$ cycle of the clock signal CLOCK, corresponding to the digital input value of 12. Thus, in this operational period, the duty cycle of the pixel drive signal is such that the pixel is in its ON state, and is bright, for 12 out of the total of 16 clock cycles constituting the display period, and is in its OFF state for the remaining 4 clock cycles of the display period. Thus, the pixel is bright for a fraction 12/16 of the display period, and the apparent brightness of the pixel is 12/16 of the maximum. This is proportional to the digital input value of 12. The pixel 110 would therefore appear brighter in the second operational period than the first.

In the example just described, the pixel drive signal changes state in response to correspondence, specifically, equality, between the P-bit word of the digital sequence and the digital input value. However, the P-bit word of the digital sequence and the digital input value may correspond in other ways. For example, the P-bit word of the digital sequence and the digital input value may correspond when the higher-order bits of the P-bit word of the digital sequence and the digital input value are equal. As another example, the P-bit word of the digital sequence and the digital input value may correspond when a predetermined offset exists between the P-bit word of the digital sequence and the digital input value.

Figure 3B:
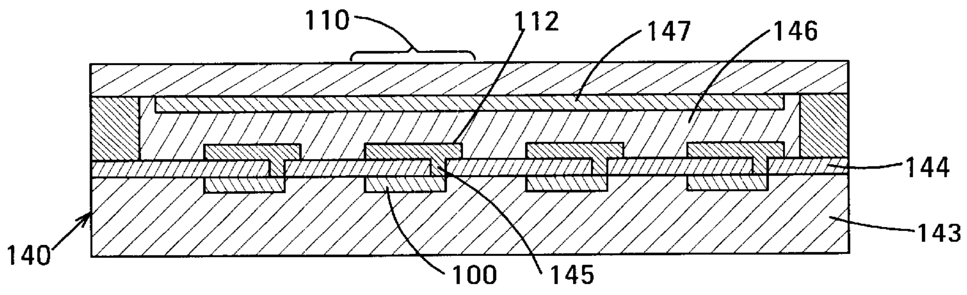
FIG. 3B is a cross-sectional view showing the display element shown in FIG. 3A as part of a light valve for use in a microminiature, wearable display.

FIG. 3A shows the pixel driver 100 as part of the display element 140 that includes the highly-simplified array 142 of 4×3 pixels, including the pixel 110. Typically, the array would be composed of 640×480 pixels, 1280×960 pixels or some other large number of pixels. FIG. 3B shows the display element 142 as part of a light valve for use in a microminiature, wearable display. In this light valve, the electro-optical transducer controlled by the display element is a layer of ferroelectric liquid crystal material.

In the display element 142, each pixel includes a digital pixel driver similar to the pixel driver 100. The pixel drivers and their associated circuits 114, 116-1 to 116-4, 148 and 150 are formed using conventional semiconductor fabrication techniques in and on the silicon substrate 143, as shown in FIG. 3B. The pixel drivers are covered by an insulating layer 144 that supports the pixel electrode of each pixel, including the pixel electrode 112 of the pixel 110. The pixel electrode 112 is electrically connected to the output of the pixel driver 100 by the conductor 145 that passes through the thickness of the insulating layer. This arrangement enables the pixel electrodes to occupy most of the surface area of the substrate and maximizes the fill factor of the display.

A layer 146 constituting the electro-optical transducer is sandwiched between the pixel electrodes and the transparent common electrode 147. The electro-optical transducer may be a layer of ferro-electric or nematic liquid crystal material, as shown, or may alternatively be a solid-state light-emitting material, an organic light-emitting material or some other suitable material capable of providing the pixel with a substantially binary brightness characteristic in response to the pixel drive signals generated by the pixel drivers.

In addition to the array 142 of pixel drivers, the display element 140 includes the controller 148 and the demultiplexer 150. When the pixel driver 100 is one of an array of pixel drivers, as shown in FIG. 3, the digital sequence generator 114 is common to all of the pixel drivers, and the mode switch 116 (FIG. 1) duplicated so that one mode switch is provided for each column of the array. The outputs of the mode switches 116-1, 116-2, 116-3 and 116-4 are connected to the column busses 120-1, 120-2, 120-3 and 120-4, respectively. Alternatively, the mode switches can be omitted if the demultiplexer and the digital sequence generator have tri-state outputs, i.e., outputs that have an OFF state in addition to a 1 state and a 0 state.

The data inputs of the pixel drivers of all the pixels in one column are connected to the column bus of the column. For example, the data input 119 of the pixel 110 located in column 2 is connected to the column bus 120-2.

The controller 148 operates in response to synchronizing and clock signals included in the digital video signal received at the video signal input 152 to generate the clock signal CLOCK and the control signals WRITE, MODE and RS described above. Circuits for generating such signals are known to those skilled in the art and will not be described here. The controller distributes the control signal RS to all the pixel drivers in the array 142. The controller additionally generates a different control signal WRITE for each row of the array. These control signals are labelled WR1, WR2 and WR3 in FIG. 3A. The controller sequentially generates the control signals WR1, WR2 and WR3 during each load period of the display element 140, as will be described next.

The digital video signal received at the video signal input 152 is a conventional digital video signal. Each frame of the digital video signal is composed of a stream of M-bit digital input values, one per pixel of the display element, i.e., 12 four-bit digital input values in this example. The digital input values are arranged in raster-scan order. The digital video signal passes from the video signal input to the input of the demultiplexer 150. During the load period of the display element 140, the sequentially-generated control signals WR1, WR2 and WR3 generated by the controller 148 operate together with the demultiplexer to distribute the M-bit digital input values constituting each frame of the digital video signal to the respective pixel drivers of the display element. During the load period, the control signal MODE sets the mode switches 116-1 to 116-4 to the state in which they connect the outputs 154-1 to 154-4 of the demultiplexer to the column busses 120-1 to 120-4, respectively.

The demultiplexer 150 first receives the digital input values constituting the first line of the digital video signal and distributes them to the appropriate ones of the column busses 120-1 to 120-4 through the mode switches 116-1 to 116-4. For example, the demultiplexer may be a four-stage shift register connected to the mode switches 116-1 to 116-4 in a manner that distributes the first digital input value of the line to input of the mode switch 116-1 and thence to the column bus 120-1 of the first column. The column busses distribute the digital input values of the first line of the digital video signal to all the pixel drivers in the array 142. The controller then generates the control signal WR1, which will be described below with reference to FIG. 4D, and supplies this control signal only to the pixel drivers in the first row of the array. The control signal WR1 causes the digital input values to be written into the N-bit registers of only the pixel drivers in the first row.

The demultiplexer 150 then receives the digital input values constituting the second line of the digital video signal and distributes them to the respective column busses 120-1 to 120-4 through the mode switches 116-1 to 116-4. The column busses again distribute the digital input values to all the pixel drivers. The controller then generates the control signal WR2, which will be described in detail below with reference to FIG. 4E, and supplies this control signal only to the pixel drivers in the second row, including the pixel driver 100. The control signal WR2 causes the digital input values to be written into the N-bit registers of only the pixel drivers in the second row.

Figures 4A, 4B, 4C, 4D, 4E, 4F, 4G, 4H, 4I, 4J, 4K, 4L, 4M, 4N, 4O, 4P:
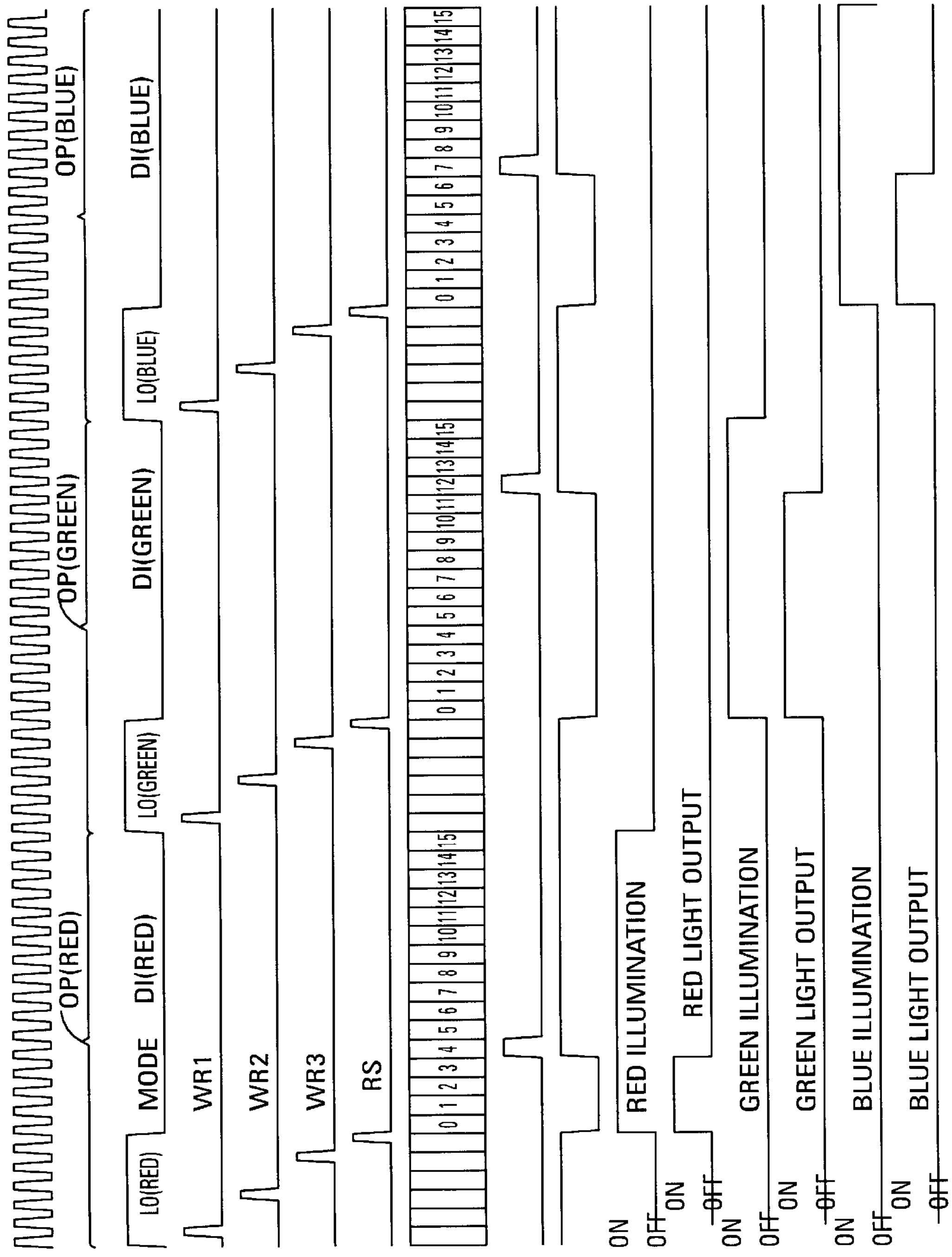
FIGS. 4A–4P illustrate the operation of a display element incorporating the first embodiment of the digital pixel driver in response to three sequential digital input values representing color components to display one color picture.

Finally, the demultiplexer 150 receives the digital input values constituting the third line of the digital video signal. The control signal WR3, which will be described below with reference to FIG. 4F, is asserted to cause the digital input values of the third line of the digital video signal to be written into the N-bit registers of only the pixel drivers in the third row. The processing just described distributes the digital input values constituting each frame of the digital video signal to the respective pixel drivers of the array 142.

During the display period of the display element 140, the control signal MODE changes the mode switches 116-1 to 116-4 to the state in which they connect the output of the digital sequence generator 114 to all of the column busses 120-1 to 120-4. The digital sequence generator generates the digital sequence of P-bit (P=4 in this example) words. The digital sequence is distributed through the mode switches and the column busses 120-1 to 120-4 to the data inputs 119 of all the pixel drivers. During the display period, the pixel drivers operate in parallel in response to the digital sequence and the control signal RS, as described above with reference to FIGS. 2G–2L, each to generate a respective pixel drive signal that is applied to the pixel electrode of the corresponding pixel. The duty cycle of the pixel drive signal generated by the pixel driver determines the apparent brightness of the respective pixel in response to the respective digital input value received and stored in the pixel driver.

The display element 140 incorporating the first embodiment 100 of the pixel driver may also be used as part of a color display having a color resolution equal to that of the digital video signal. The pixel driver operates in response to an M-bit digital input value constituting the portion of a digital video signal representing one pixel. The M-bit digital input value defines the apparent brightness of the pixel for more than color component. Typically, the digital input value defines the apparent brightness of the pixel for red, green and blue color components. However, the number color components and the color components themselves are not critical to the invention.

In this example, of the M bits of the digital input value, a first set of P bits, which will be called red bits, define the apparent brightness of the pixel for the red color component, a second set of P bits, which will be called green bits, define the apparent brightness of the pixel for the green color component and the final set of P bits, which will be called blue bits, define the apparent brightness of the pixel for the blue color component. Typically, P=M/3, and N=P. The order of the bits representing the color components is unimportant, and it is merely convenient but not essential that the same number of bits is used for each color component.

For each color component, the pixel driver 100 generates a pixel drive signal having one of $2^P$ discrete duty cycles, the each one of the duty cycles being determined by the corresponding bits of the digital input value. A pixel drive signal having one of $2^P$ discrete duty cycles for each color component is capable of setting the apparent brightness of the pixel to a corresponding one of $2^P$ discrete brightness levels for that color component. Since it is desirable for the apparent brightness resolution of each color component to be similar to that of the monochrome version, the value of M in the color version is typically about three times that of the value of M in the monochrome version.

When forming part of a color display element, the pixel driver 100 operates separately on each color component. That is, in a red operational period, the P red bits of the M-bit digital input value are loaded into the pixel driver, and the pixel driver then performs a display operation in response to the red bits using red light. The red operational period is followed by successive green and blue operational periods in each of which respective color bits are loaded into the pixel driver and the pixel driver performs a display operation using the corresponding color of light.

Operation of a display element incorporating the pixel driver 100 to display one color picture is illustrated in FIGS. 4A–4P. In the example to be described, the red bits have a value of four, the green bits have a value of 12, and the blue bits have a value of seven. FIG. 4A shows the clock signal CLOCK. FIG. 4B shows the three operational periods OP(RED), OP(GREEN) and OP(BLUE) required to display a complete color frame. FIG. 4D shows the control signal MODE. The control signal MODE is in its 1 state, indicating a load period, three times during generation of the frame. During the load period LO(RED), the P red bits (P=4 in this example) taken from the M-bit digital input value and constituting the red component thereof are loaded into the pixel drive circuit. In this example, the red bits have a value of four.

During loading the red bits of the digital video signal into the pixel drivers constituting the array 142, the write control signals WR1, WR2 and WR3 asserted as the three lines of the digital video signal are loaded into the rows of the array are shown in FIGS. 4D, 4E and 4F. Red bits are loaded into the pixel driver 100 located in the second row of the array 142 in response to the write control signal WR2.

The load period LO(RED) is followed by the red display period DI(RED). The control signal RS is asserted at the beginning of the display period is shown in FIG. 4G. The digital sequence is shown in FIG. 4H, the output of the digital comparator 106 is shown in FIG. 41, and the pixel drive signal output by the comparator 104 is shown in FIG. 4J. The pixel drive signal has a duty cycle of 4/16 of the red display period. In the red display period the display element generates, is illuminated with, or otherwise controls red light in response to the red bits. For example, when the display element includes a liquid-crystal electro-optical transducer as shown in FIG. 3B, the red illumination applied to the display element during the red display period is as shown in FIG. 4K. The resulting red light output by the pixel 110 is shown in FIG. 4L.

Next, during the load period LO(GREEN) shown in FIG. 4C, the P green bits taken from the M-bit digital input value and constituting the green component thereof are loaded into the pixel driver. In this example, the green bits have a value of 12. The load period LO(GREEN) is followed by the green display period DI(GREEN). The pixel drive signal generated during the green display period is shown in FIG. 4J and has a duty cycle of 12/16 of the green display period. In the green display period, the display element generates, is illuminated with, or otherwise controls green light in response to the green bits. For example, when the display element includes a liquid-crystal electro-optical transducer, the green illumination applied to the display element during the green display period is as shown in FIG. 4M. The resulting green light output by the pixel 110 is shown in FIG. 4N.

Finally, during the load period LO(BLUE) shown in FIG. 4C, the N blue bits constituting the blue component of the M-bit digital input value are loaded into the pixel driver. In this example, the blue bits have a value of seven. The load period LO(BLUE) is followed by the blue display period DI(BLUE). The pixel drive signal generated during the blue display period is shown in FIG. 4J and has a duty cycle of 7/16 of the green display period. In the blue display period, the display element generates, is illuminated with, or otherwise controls blue light in response to the blue bits. For example, when the display element includes a liquid-crystal electro-optical transducer, the blue illumination applied to the display element during the blue display element is as shown in FIG. 40. The resulting blue light output by the pixel 110 is shown in FIG. 4P.

When used as part of a color display, the display element 140 incorporating the first embodiment 100 of the digital pixel driver according to the invention requires that the bits of the different color components of the digital video signal be presented to it sequentially. To fulfill this requirement, a non-standard color-sequential digital video signal is required, or an internal or external frame store must be provided to convert a standard color video signal to the color-sequential video signal required. Moreover, in this and all of the embodiments to be described herein, the display element generates, is illuminated with, or otherwise controls light only during the display period, and not during the load period. Consequently, the maximum apparent brightness of the display element is determined in part by the ratio between the display period and the sum of the display period and load period. When used as part of a color display, the display element requires three load periods per complete picture displayed as shown in FIG. 4C, and therefore has a lower brightness efficiency than it would have if it had only one load period per picture.

Figure 5A:
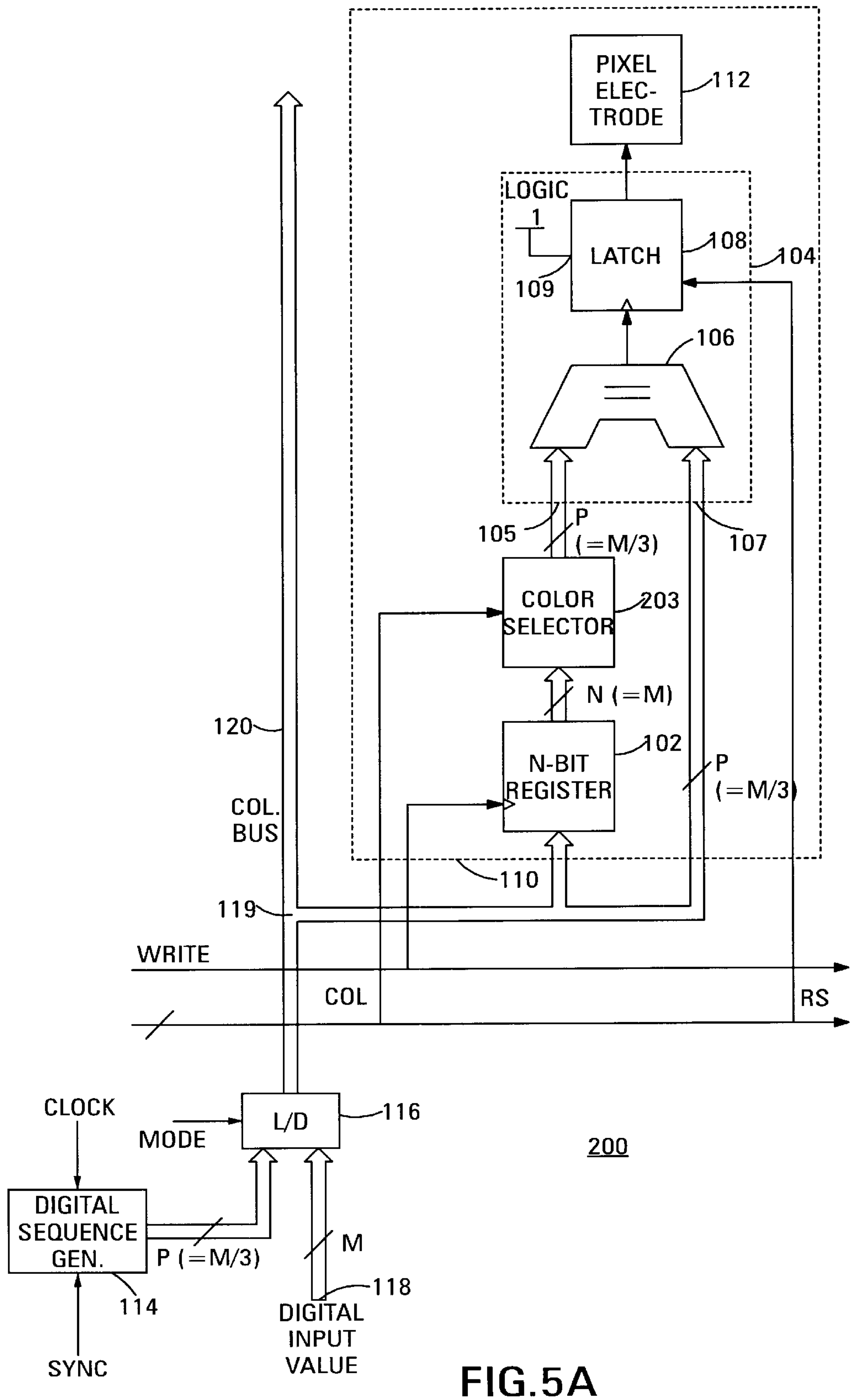
FIG. 5A is a block diagram of a second embodiment of a digital pixel driver according to the invention.

FIG. 5A shows a second embodiment 200 of a digital pixel driver according to the invention. Elements of the second embodiment that correspond to elements of the first embodiment shown in FIG. 1 are indicated using the same reference numerals, and will not be described further.

The digital pixel driver 200 is for use in a color display element having a color resolution equal to that of the digital video signal. The digital pixel driver 200 has only one load period per complete color picture displayed. The pixel driver operates in response to an M-bit digital input value constituting the portion of a digital video signal representing one pixel. The M-bit digital input value defines the apparent brightness of the pixel for more than color component. Typically, the digital input value defines the apparent brightness of the pixel for red, green and blue color components. However, the number color components and the color components themselves are not critical to the invention.

Of the M bits of the digital input value, a first set of P bits, which will be called red bits, define the apparent brightness of the pixel for the red color component, a second set of P bits, which will be called green bits, define the apparent brightness of the pixel for the green color component and a final set of P bits, which will be called blue bits, define the apparent brightness of the pixel for the blue color component. Typically, P=M/3. The order of the bits representing the color components is unimportant, and it is merely convenient but not essential that the same number of bits is used for each color component.

For each color component, the pixel driver 200 generates a pixel drive signal having one of $2^P$ discrete duty cycles determined by the corresponding bits of the digital input value. A pixel drive signal having one of $2^P$ discrete duty cycles is capable of setting the apparent brightness of the pixel to a corresponding one of $2^P$ discrete brightness levels. Since it is desirable for the apparent brightness resolution for each color component in this embodiment to be similar to that of the monochrome version of the first embodiment, the value of M in this embodiment is typically about three times that of the value of M in monochrome version of the first embodiment.

In the digital pixel driver 200, the N-bit register 102 stores the entire M-bit digital input value that forms part of the digital video signal, i.e., N=M in this embodiment. Thus, unlike the color display element based on the first embodiment 100 of the pixel driver, whose operation was described above with reference to FIGS. 4A–4P, a display element that incorporates the pixel driver 200 operates with a standard digital video signal, and requires only one load period per displayed color picture. The load period is followed by three display periods during each of which the display element generates, is illuminated with, or otherwise controls light of a different color.

During each of the three display periods, the digital sequence generator 214 generates one digital sequence composed of P-bit words. In this second embodiment, the words constituting the digital sequence have the same number of bits as the set of bits of the digital input value that defines each color component, i.e., P=M/3 in this embodiment. In this second embodiment, each digital sequence generated by the digital sequence generator 214 has the same characteristics as the single digital sequence generated by the digital sequence generator 114 shown in FIG. 1.

Figure 5B:
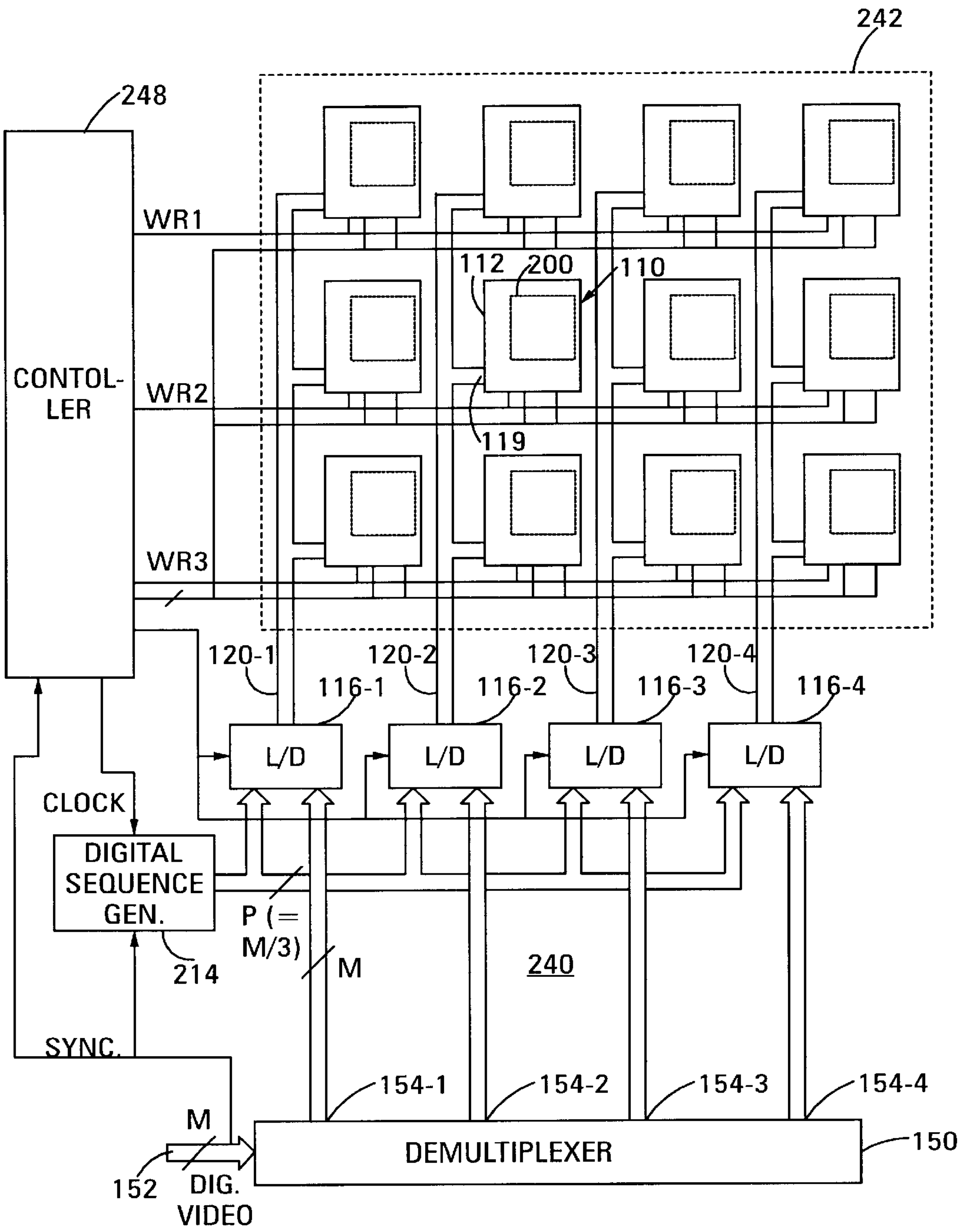
FIG. 5B is a block diagram of a display element that includes a highly-simplified array 4×3 pixels each incorporating the second embodiment of the digital pixel driver according to the invention.

The digital pixel driver 200 differs from the digital pixel driver 100 in that it includes the color selector 203 interposed between the output of the N-bit register 102 and the input 105 of the comparator 104. The color selector operates during the display periods in response to the control signal COL generated by the controller 248 (FIG. 5B). The state of the control signal COL indicates the color of the light being generated, illuminating, or otherwise being controlled during the display period. During each display period, the color selector selects the sets of P bits from the M-bit input value stored in the N-bit register 102. The sets of P bits selected correspond to the color of the light being generated, illuminating, or otherwise being controlled during the display period. For example, during the display period in which the color of the light being generated, illuminating or otherwise being controlled is red, the color selector selects the red bits from the digital input value stored in the N-bit register. The comparator 104 then compares the bits selected by the color selector with the digital sequence generated by the digital sequence generator 114.

In most applications, the digital pixel driver 200 constitutes one of an array 242 of pixel drivers forming the display element 240 shown in FIG. 5B. Elements of the display element shown in FIG. 5B that correspond to elements of the display element shown in FIG. 3A are indicated using the same reference numerals and will not be described further. When the pixel driver 200 constitutes part of the array 242, the digital sequence generator 214 is common to all the pixel drivers in the array, and the mode switch 116 is common to all the pixel drivers in one column of the array, as described above. The controller 248 is similar to the controller 148 described above with reference to FIG. 3A, but additionally generates the control signal COL. The control signal COL is fed to all the pixel drivers constituting the array and additionally controls the color of light generated by, illuminating or otherwise controlled by the display element 240.

Operation of the second embodiment 200 of the pixel driver according to the invention in the display element 240 that includes the array 242 of pixel drivers will be described next with reference to FIGS. 5A, 5B and 6A–6P. Operation of the pixel driver to display one pixel of one color picture will be described.

Figures 6A, 6B, 6C, 6D, 6E, 6F, 6G, 6H, 6I, 6J, 6K, 6L, 6M, 6N, 6O, 6P:
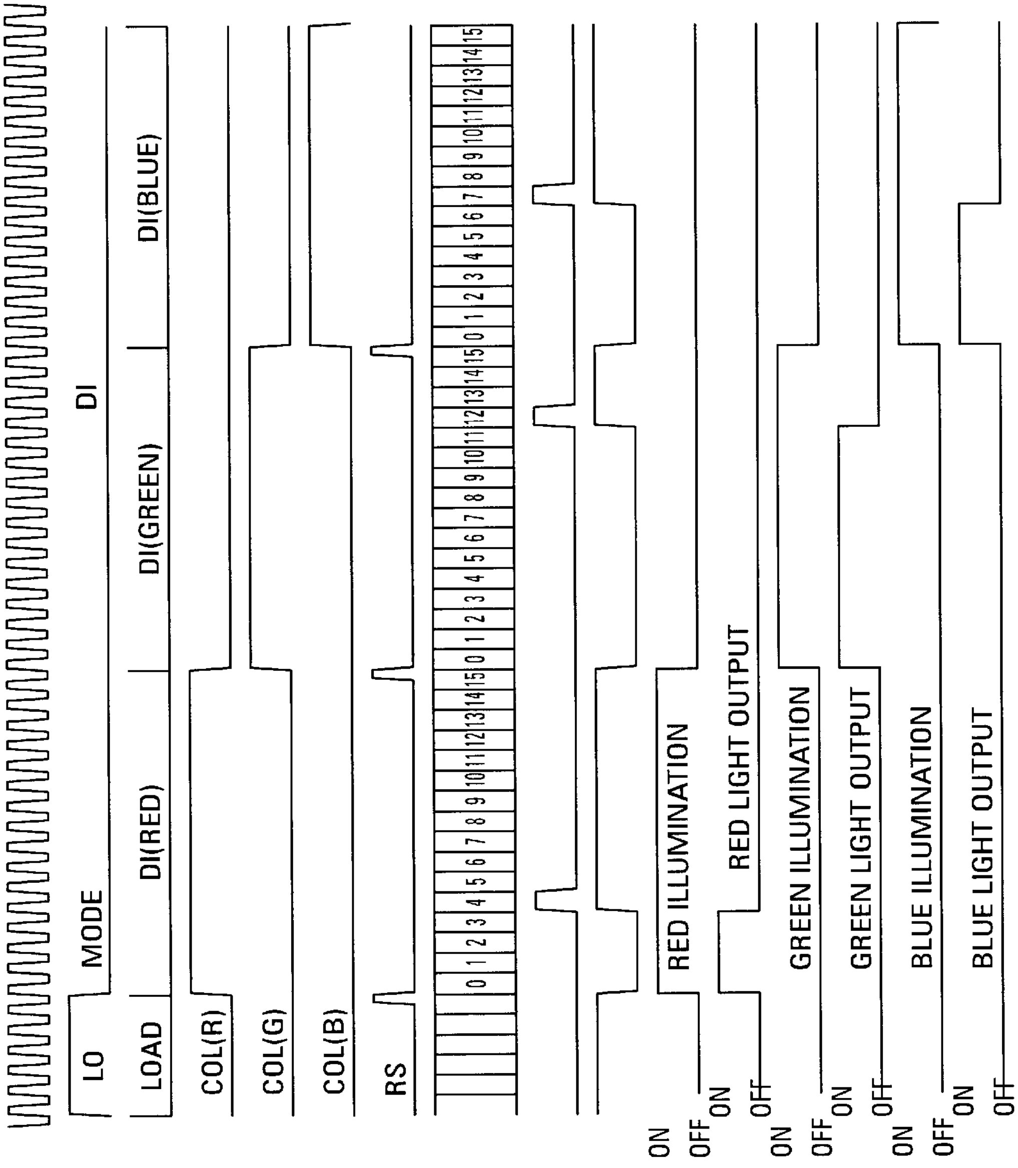
FIGS. 6A–6P illustrate the operation of a display element incorporating the second embodiment of the digital pixel driver in response to a single digital input value representing color components to display one color picture.

FIG. 6A shows the clock signal CLOCK. FIG. 6B shows the control signal MODE. All M bits of the digital input value are written into the N-bit register 102 (N=M in this embodiment) in the single load period LO, as shown in FIG. 6C. During the load period LO, the M-bit (M=12 in this example) digital input value representing the apparent brightness of the pixel in the red, the green and the blue is loaded into the pixel driver 200. When the pixel driver 200 is a member of the 3-row array 242 of pixel drivers shown in FIG. 5B, the digital input values constituting the entire frame are loaded into the respective pixel drivers in three write operations in response to the write control signals WR1, WR2 and WR3 in a manner similar to that described above with reference to FIGS. 4D, 4E and 4F.

The load period LO is followed by three display periods, namely, the red display period DI(RED), the green display period DI(GREEN) and the blue display period DI(BLUE), as shown in FIG. 6C. In the example shown, the color control signal COL is composed of the three components COL(R), COL(G) and COL(B), shown in FIGS. 6D, 6E and 6F, respectively. Each of these control signals is in the 1 state during the corresponding display period and is in its 0 state at all other times. The control signal RS is asserted at the beginning of each display period to reset the pixel drive signal output by the pixel driver 200 to its 0 state, as shown in FIG. 6G. The 0 state of the pixel drive signal sets the pixel to its ON state in which the pixel generates, transmits, reflects or otherwise controls light so that it is bright. The digital sequence generator generates the digital sequence once during each display period, as shown in FIG. 6H. The output of the digital comparator 106 is shown in FIG. 6I, and the pixel drive signal output by the comparator 104 is shown in FIG. 6J.

The change in state of the control signal MODE at the end of the load period LO, as shown in FIG. 6C, causes the control signal component COL(R) to change to its 1 state and causes the digital sequence generator to start to generate a first digital sequence. This marks the beginning of the red display period DI(RED). The control signal component COL(R) causes the color selector 203 to select from the M-bit digital input value stored in the N-bit register 102 the set of P red bits that define the apparent brightness of the pixel 110 for the red color component. The color selector feeds the red bits to the input 105 of the comparator 104. The comparator compares the red bits with the first digital sequence generated by the digital sequence generator 214. In the example shown in FIGS. 6A–6P, the red bits have a value of four. Consequently, the output of the digital comparator 106 and the pixel drive signal applied to the pixel electrode change state at the end of the fourth clock cycle of the red display period, as shown in FIGS. 6I and 6J, respectively. During the red display period, the display element generates, is illuminated with, or otherwise controls red light. For example, the red illumination applied to the display element when the display element includes a liquid-crystal electro-optical transducer is shown in FIG. 6K. The resulting red light output by the pixel 110 is shown in FIG. 6L.

After the first digital sequence has reached its maximum value, the control signal component COL(R) reverts to its 0 state as shown in FIG. 6D, the control signal component COL(G) changes to its 1 state as shown in FIG. 6E, and the digital sequence generator 114 starts to generate a second digital sequence, as shown in FIG. 6H. This marks the beginning of the green display period DI(GREEN). The control signal RS is again asserted to reset the latch 108, which resets the pixel drive signal output by the pixel driver 200 to its 0 state. The control signal component COL(G) causes the color selector 203 to select from the M-bit digital input value stored in the N-bit register 102 the P green bits that define the apparent brightness of the pixel 110 for the green color component. The color selector feeds the green bits to the input 105 of the comparator 104, which compares the green bits with the second digital sequence generated by the digital sequence generator. In this example, the green bits have a value of 12. Consequently, the output of the digital comparator 106 and the pixel drive signal applied to the pixel electrode 112 change state at the end of the $12^{th}$ clock cycle of the green display period, as shown in FIGS. 6I and 6J, respectively. During the green display period, the display element generates, is illuminated with, or otherwise controls green light. For example, the green illumination applied to the display element when the display element includes a liquid-crystal electro-optical transducer is shown in FIG. 6M. The resulting green light output by the pixel 110 is shown in FIG. 6N.

Finally, after the second digital sequence has reached its maximum value, the control signal component COL(G) reverts to its 0 state, as shown in FIG. 6D, the control signal component COL(B) changes to its 1 state, as shown in FIG. 6E, and the digital sequence generator 114 starts to generate a third digital sequence, as shown in FIG. 6H. This marks the beginning of the blue display period DI(BLUE). The control signal RS is again asserted to reset the latch 108, which resets the pixel drive signal output by the pixel driver 200 to its 0 state. The control signal component COL(B) causes the color selector 203 to select from the M-bit digital input value stored in the N-bit register 102 the P blue bits that define the apparent brightness of the pixel 110 for the blue color component. The color selector feeds the blue bits to the input 105 of the comparator 104. The comparator compares the blue bits with the third digital sequence generated by the digital sequence generator 214. In this example, the blue bits have a value of seven. Consequently, the output of the digital comparator 106 and the pixel drive signal applied to the pixel electrode 112 change state at the end of the seventh clock cycle of the blue display period, as shown in FIGS. 6I and 6J, respectively. During the blue display period, the display element generates, is illuminated with, or otherwise controls blue light. For example, the blue illumination applied to the display element when the display element includes a liquid-crystal electro-optical transducer is shown in FIG. 6O. The resulting blue light output by the pixel 110 is shown in FIG. 6P. Thus, the digital pixel driver 200 sequentially defines the apparent brightness of the pixel 110 in red, green and blue light in response to the digital input value.

Monochrome and color display elements based on the digital pixel driver 100 shown in FIG. 1 and color display elements based on the digital pixel driver 200 shown in FIG. 5A have substantial advantages over conventional pixel drivers. The digital pixel drivers disclosed herein generate a pixel drive signal having only one change of state per display period. This is in contrast to the above-mentioned conventional digital pixel drivers which generate bitwise time domain binary weighted sequences having many changes of state per display period. Accordingly, the pixel drive signals generated by the pixel drivers 100 and 200 provide the same advantages in terms of the ferroelectric liquid crystal material bandwidth, buffer organization and link efficiency as the analog pixel drivers described in U.S. patent application Ser. Nos. 09/070,487 and 09/070,669 referred to above.

Additionally, monochrome display elements based on the digital pixel driver 100 and color display elements based on the digital pixel driver 200 optionally have a low-power operation mode that can be used when the digital video signal is other than a full-motion video signal. The low-power operation mode makes the digital pixel drivers especially attractive for use in portable and handheld devices. Since the pixel driver contains digital memory, a digital video signal representing a picture can be loaded into the display element once. The picture can then be repetitively displayed without the need to reload the digital video signal until the picture changes. Display elements based on conventional analog and digital pixel driver circuits, when displaying static or slow-moving pictures, require that the video signal representing the picture be constantly reloaded into their pixel driver circuits. This may require, for example, an additional off-chip buffer memory, and the circuits required to reload the video signal constantly consume substantial power. Thus, for applications such as digital cameras, fax viewers, electronic books and other devices that display largely static pictures, the system-level power savings afforded by the digital pixel drivers according to the invention can be quite significant.

The digital memory included in the digital pixel driver 200 provides a color display element incorporating such digital pixel drivers with the option of being operated with a display rate faster than the frame rate of the digital video signal. For example, the display element can be configured to display each color component two or more times during each frame period of the digital video instead of displaying each color component only once. Operating the display element at an increased display rate reduces artifacts, such as color fringing on moving objects, that are conventionally associated with displays that sequentially display the color components of the picture.

In a monochrome display element based on the digital pixel driver 100 shown in FIG. 1 and a color display element based on the digital pixel driver 200 shown in FIG. 5A, loading the entire M-bit digital input value into the N-bit register enables a pixel that includes the pixel driver to display the entire grey-scale or color gamut of the digital video signal. However, the need to store a substantial number of bits in the pixel driver imposes a minimum size on the pixel and, hence, on the number of pixels that can be accommodated on a semiconductor chip of a given size. Since it is undesirable to increase the size of the chip for reasons of cost and production yield, to increase the number of pixels per chip requires that some way be found to reduce the size of the pixel drivers. One way to reduce the size of the pixel drivers is to reduce the number of bits stored in the N-bit register, i.e., to reduce the value of N. However, if done conventionally, this leads to a reduction in the color or grey-scale resolution of the display element.

One way to reduce the number of bits stored in the N-bit registers in a color display element without reducing the color resolution is to use a display element that incorporates the digital pixel driver 100, operated as described above with reference to FIGS. 4A–4P, rather than one that incorporates the pixel driver 200. However, a display element incorporating the former pixel driver has less brightness efficiency than a display element that incorporates the latter digital pixel driver 200. Moreover, such a display element cannot easily be operated in the above-mentioned low power mode and requires additional circuitry to convert a conventional digital video signal to a non-standard format.

Paletized color rendering schemes are known in the art. In such schemes, the picture is rendered using a palette of $2^N$ colors instead of using the $2^M$ colors that can be defined by an M-bit digital video signal, where N<M. The palette of $2^N$ colors is a subset of the full gamut of $2^M$ colors so that the color resolution among the $2^N$ colors in the palette is the same as that among the $2^M$ colors. However, any one picture is rendered using only $2^N$ different colors. With paletized rendering, the number of colors used to render the picture is substantially reduced, but the color resolution among the colors can be the same as that defined by the original color video signal. Similarly, paletized grey-scale rendering schemes are known in which the picture is rendered using a palette of $2^N$ grey-scale values instead using the $2^M$ grey-scale levels that can be defined by an M-bit digital video signal, where N<M. Since N<M, modifying the pixel driver according to the invention to display paletized color or grey scale enables the number of bits processed by the pixel driver, and hence the size of the pixel driver, to be reduced.

Techniques for converting a color or monochrome video signal that defines a picture using M bits per pixel to render the picture using a palette of a smaller number of colors or grey-scale levels are known in the art, and will not be described here. See, for example, U.S. Pat. No. 4,232,311 to Agneta, U.S. Pat. No. 4,484,187 to Brown et al. and U.S. Pat. No. 4,710,806 to Iwai et al. Such techniques generate a palette code table in which each element of the palette represents a range of digital pixel values of the digital video signal. Each element of the palette is identified by an N-bit palette and is one color or grey-scale level of the digital video signal defined in terms of color component values or a grey-scale value, respectively, of the digital video signal. The digital input value defining each pixel in the digital video signal is compared with the palette code table to determine the element of the palette that most nearly matches the digital input value, and the palette code that represents the element is output to represent the digital input value.

Figures 7A, 7B, 7C, 10:
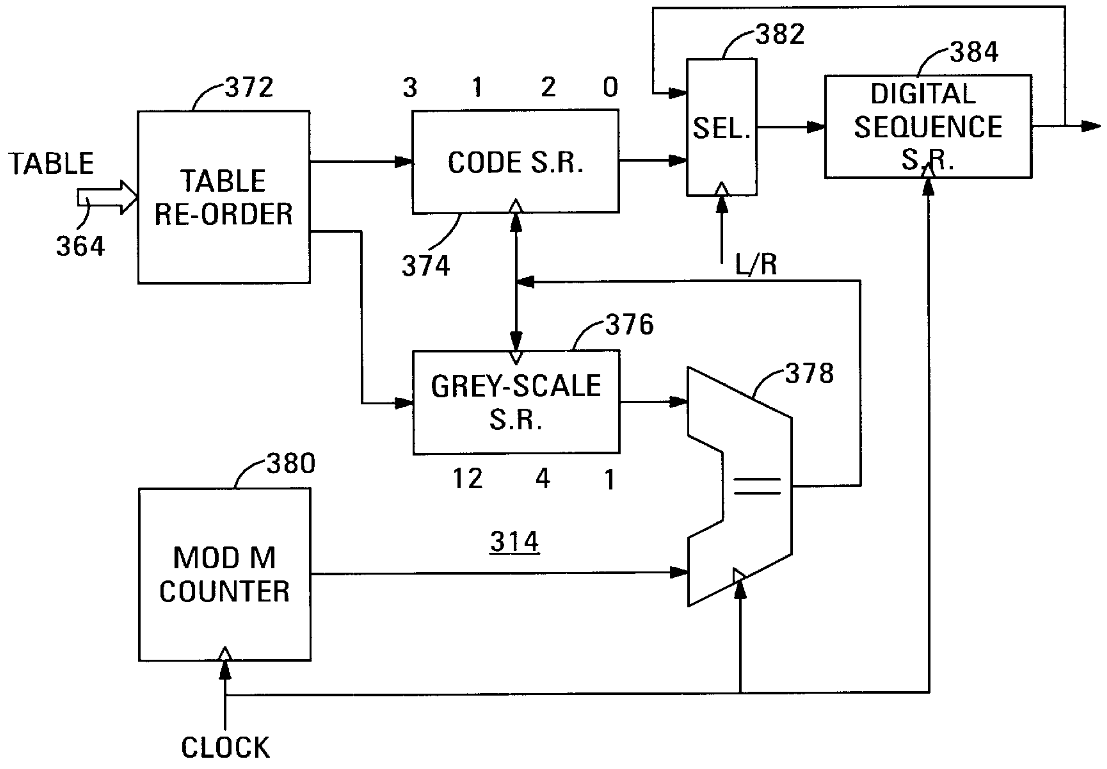
FIG. 7A shows an exemplary palette table for a color palette.
FIG. 7B shows an exemplary palette table for a grey-scale palette.
FIG. 7C shows an exemplary component table derived from the palette table shown in FIG. 7A.
FIG. 10 is a block diagram showing an example of the digital sequence generator of the third embodiment of the digital pixel driver according to the invention.

FIG. 7A shows a highly-simplified example of a palette code table in which each element of the palette is a color represented by a 2-bit palette code and defined by three color components, each of which has a 4-bit component value. The binary words are represented by decimal numbers in the Figure to simplify the drawing. The palette code table is composed of four columns, one for the palette code and one for each of the three component values of the color it represents. The exemplary palette shown is composed of three of the 4,096 colors that can be represented by a 12-bit (3×4-bit) digital input value. Each of the three colors in the palette is defined with a resolution of 3×4 bits.

In a more typical example, each element of the palette would be a color represented by an 8-bit palette code and defined by three color components, each of which has an 8-bit component value. Such a palette would be composed of 255 of the 16.7 million colors that can be represented by a 24-bit (3×8-bit) digital input value. However, although the palette is composed of only 255 colors, each color is defined by three 8-bit component values, so that the colors in the palette can subtly differ from one-another, if needed. For example, the palette may contain two colors that differ by as little as one least-significant bit in one of 8-bit component values.

In the palette code tables described herein, one of the palette codes is reserved and cannot be used to represent a color or grey-scale level. In the examples shown, the reserved palette code is 0. Each of the other palette codes represents one element of the palette. In the example shown, the palette code 1 represents an element having a red component value of 15, a green component value of 3 and a blue component value of 7.

FIG. 7B shows a highly-simplified example of a grey-scale palette code table in which each element of the palette is a grey-scale level represented by a 2-bit palette code and defined by a 4-bit grey-scale value. The grey-scale palette code table is composed of two columns, one for the palette code and one for the grey-scale value it represents. In the example shown, the palette is composed of three grey-scale levels, each defined by a 4-bit grey-scale value (M=4) and identified by a 2-bit (N=2) palette code. The grey-scale levels in the palette are selected from the 16 grey-scale levels represented by the original 4-bit digital input value.

Figure 8A:
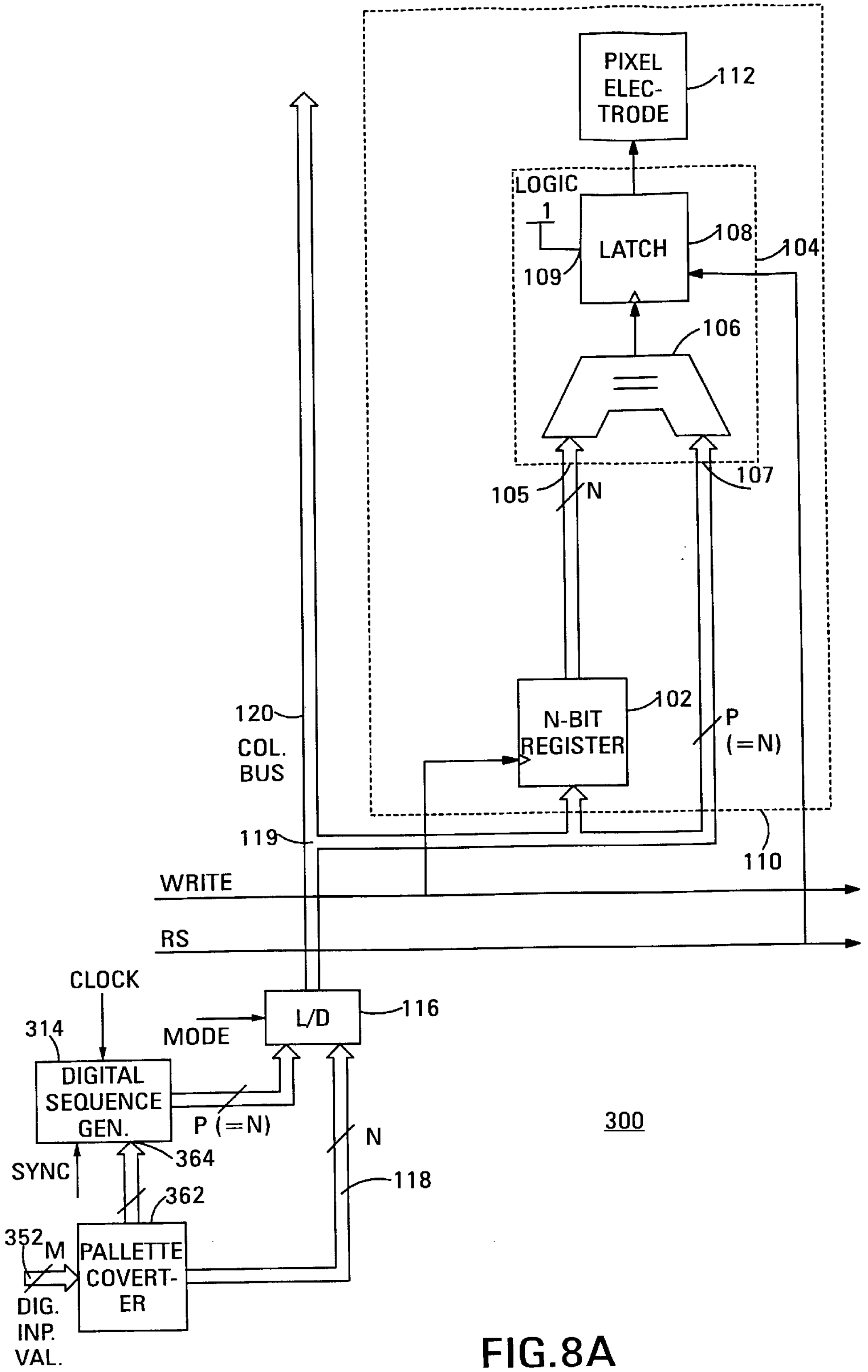
FIG. 8A is a block diagram of a third embodiment of a digital pixel driver according to the invention.

FIG. 8A shows a third embodiment 300 of a digital pixel driver according to the invention. In this embodiment, a palette code is derived from the digital input value, and the pixel driver receives and stores the palette code in lieu of the digital input value. This reduces the number of bits stored in the N-bit register, and, hence, the size of the pixel driver. The third embodiment of the pixel driver can be used in a monochrome display element, and can additionally be operated in a manner similar to that described above with reference to FIGS. 4A–4P in a color display element.

The pixel driver 300 receives an M-bit digital input value constituting the portion of a digital video signal representing one pixel, but drives the pixel electrode 112 with a pixel drive signal having one of ($2^N$−1) discrete duty cycles, where N<M, and N is the maximum number of bits that can be stored in the N-bit register. The duty cycle of the pixel drive signal is defined by the digital input value. The duty cycles may differ from one another by as little as $1/2^M$ of the duty cycle.

A pixel drive signal having one of ($2^N$−1) discrete duty cycles is capable of setting the apparent brightness of the pixel to a corresponding one of ($2^N$−1) discrete brightness levels that range from a minimum brightness to a maximum brightness. The brightness of the minimum brightness and the maximum brightness depends on the grey-scale values that constitute the palette of ($2^N$−1) grey-scale values. The pixel driver therefore provides a grey-scale having fewer levels than the grey scale defined by M bits, although the resolution among the grey-scale levels constituting the palette is the same as that provided by a pixel drive signal having $2^M$ discrete duty cycles.

Elements of the digital pixel driver 300 that correspond to elements of the pixel driver 100 shown in FIG. 1 are indicated using the same reference numerals and will not be described further. In particular, the portion of the digital pixel driver 300 that resides in the pixel 110 is the same as the portion of pixel driver 100 that resides in the pixel except that, for a given grey-scale resolution, the N-bit register 102 stores fewer bits, and the comparator 104 compares fewer bits. Consequently, the portion of the pixel driver 300 that resides in the pixel can be smaller than the corresponding portion of the pixel driver 100. Moreover, the area of the chip on which pixels can be located can be maximized by locating the palette converter 362 and at least part of the digital sequence generator 314, both of which will be described below, on a different chip.

The pixel driver 300 is for use in a monochrome display element or a color display element in which the color components are sequentially loaded in color-specific load periods, as shown in FIGS. 4A–4P. Consequently, the input 105 of the comparator 104 receives all N bits stored in the N-bit register 102.

The pixel driver 300 additionally includes the palette converter 362 located ahead of the mode switch 116. The palette converter receives the digital input value and uses known techniques to select the one of the $(2^N-1)$ grey-scale levels in the palette that is most appropriate to render the grey-scale level represented by the digital input value. The palette converter feeds the N-bit palette code that represents the selected grey-scale level to the N-bit register 102 via the mode switch. Palette converters are known in the art, so the palette converter 362 will not be described further.

The palette converter 362 additionally feeds the palette code table or other data that define the relationship between the grey-scale values defining the grey-scale levels of the palette and the N-bit codes that represent them, to the data input 364 of the digital sequence generator 314. In this example, a palette code table having the form of the palette code table shown in FIG. 7B is fed to the digital sequence generator. Typically, the palette converter will change the palette from time-to-time in response to the digital video signal. Each time it changes the palette, the palette converter feeds a new palette code table to the digital sequence generator.

The digital sequence generator 314 operates in response to the palette code table to generate a digital sequence in which each palette code in the palette code table is located at a point temporally corresponding to the duty cycle of the pixel drive signal defined by the grey-scale value represented by the palette code. For example, assume that the digital input value and the grey-scale values representing the grey scale levels in the palette are 4-bit words, i.e., M=4, and that the palette code is a 2-bit word, i.e., N=2. The grey scale has 16 levels and the palette includes $(2^2-1)=3$ grey-scale levels, each represented by a 4-bit grey-scale value. The palette code 0 is reserved and is not available to represent a grey-scale level. The remaining three grey-scale levels, having grey-scale values of a, b and c each in the range from 0 to 15, are represented by the palette codes of 1, 2 and 3, respectively. The display period and the pixel drive signal have a temporal duration defined by the temporal duration of the digital sequence. Since the grey-scale values are 4-bit words, the pixel drive signal generated by the pixel driver 300 has one of 16 discrete duty cycles and changes state at one of 16 discrete temporal points in the display period. The temporal points are defined by a clock signal having a clock period equal to 1/16 of the display period. The digital sequence generator 314 locates each palette code at the point in the digital sequence temporally corresponding to the duty cycle of the pixel drive signal defined by the grey-scale value represented by the palette code by locating the palette codes 1, 2 and 3 in the digital sequence at points a clock cycles, b clock cycles and c clock cycles, respectively, from the start of the display period.

The digital sequence generator 314 will be described further below with reference to FIG. 10.

There is no need for the palette codes to increase in the order of the grey-scale levels they represent, e.g., if $c<a<b$, the order of the palette codes in the digital sequence would be 3, 1, 2. The locations in the digital sequence that correspond to duty cycles defined by none of the grey-scale values in the palette can be filled with the reserved palette code, i.e., a palette code 0 in this example. Alternatively and preferably, each palette code can be repetitively inserted into the digital sequence until the next palette code is inserted. However, when this is done, the reserved palette code must be inserted into the digital sequence up to the location in which is inserted the palette code that identifies the shortest duty cycle.

Figure 8B:
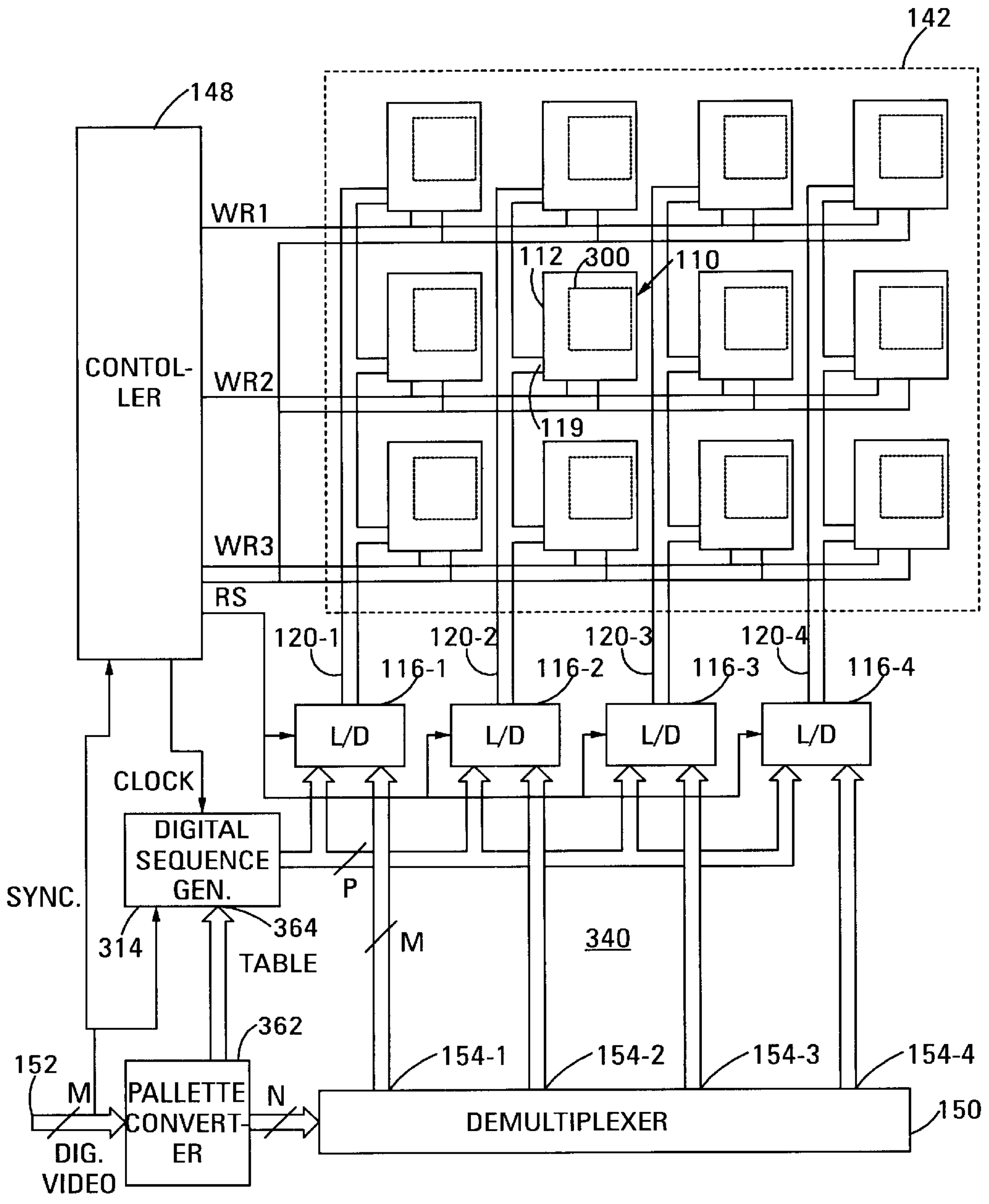
FIG. 8B is a block diagram of a display element that includes a highly-simplified array 4×3 pixels each incorporating the third embodiment of the digital pixel driver according to the invention.

In most applications, the digital pixel driver 300 constitutes one of an array 142 of pixel drivers forming the display element 340 shown in FIG. 8B. Elements of the display element shown in FIG. 8B that correspond to elements of the display elements shown in FIGS. 3A and 5B are indicated using the same reference numerals and will not be described further. When the pixel driver 300 constitutes part of the array 142, the digital sequence generator 314 and the palette converter 362 are common to all the pixel drivers in the array, and the mode switches 116-1 to 116-4 are common to all the pixel drivers in one column of the array.

Figures 9A, 9B, 9C, 9D, 9E, 9F, 9G, 9H, 9I, 9J, 9K, 9L:
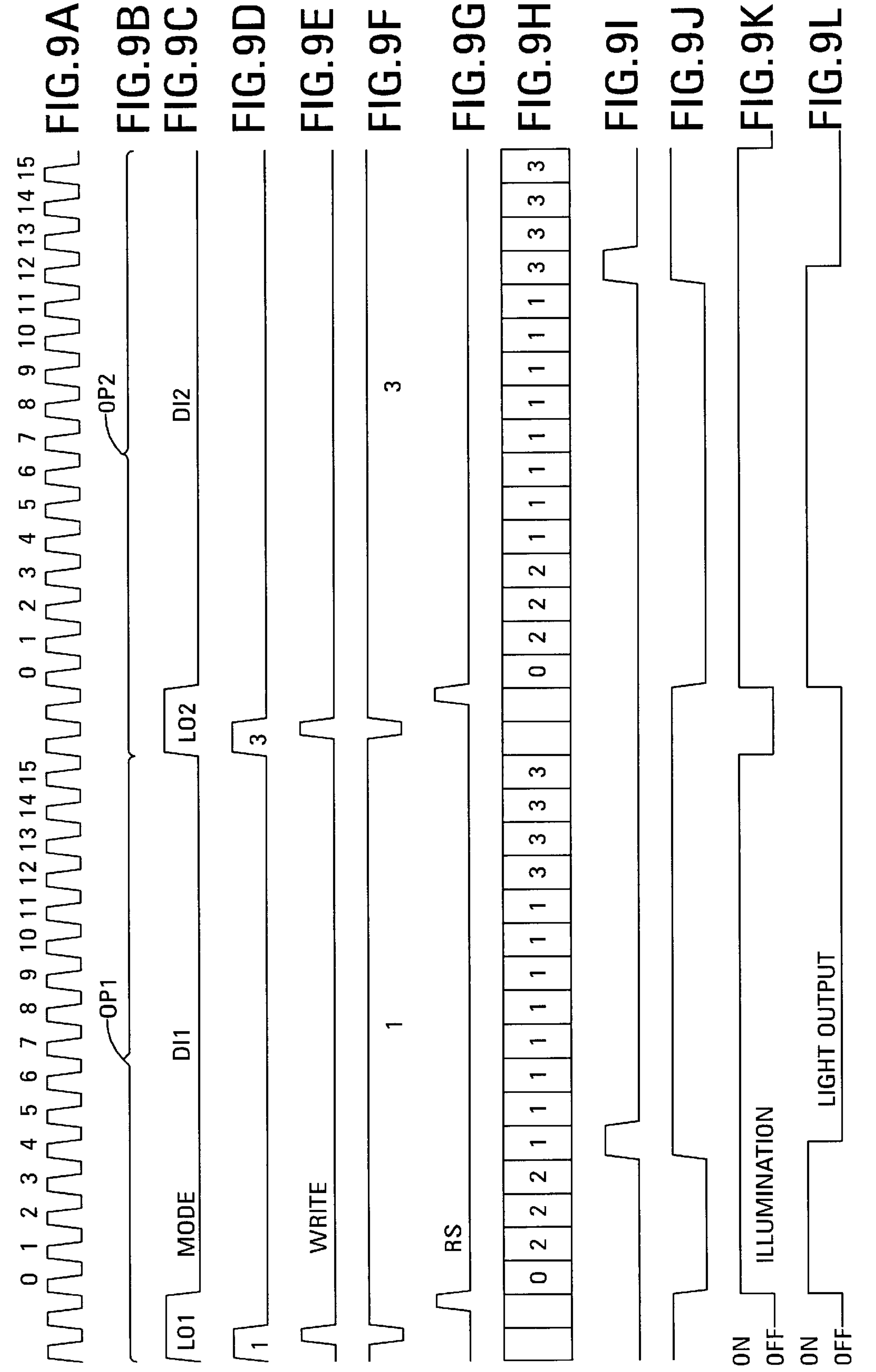
FIGS. 9A–9L illustrate the operation of a display element incorporating the third embodiment of the digital pixel driver in response to two consecutive digital input values to display two consecutive monochrome pictures.

Operation of the digital pixel driver 300 will now be described with reference to FIGS. 8A, 8B and 9A–9L. In the example shown, the digital input value is a 4-bit word, the palette converter represents the digital input value as a 2-bit palette code. Consequently, the N-bit register 102 has a capacity of two bits, and the digital sequence generator 114 generates a digital sequence composed of 16 two-bit words. In other words, M=4 and N=P=2 in this example. The digital pixel driver operates in response to the clock signal CLOCK shown in FIG. 9A. Operation of the digital pixel driver circuit in the two consecutive operational periods OP1 and OP2 shown in FIG. 9B will be described. FIG. 9C shows the control signal MODE that is in the 1 state during the load period LO and is in the 0 state during the display period DI of each operational period. The load period LO1 followed by the display period DI1 constitute the operational period OP1 and the load period LO2 followed by the display period DI2 constitute the operational period OP2.

Before the control signal WRITE is asserted towards the end of each load period, the palette converter 362 generates a palette code in response to the digital input value. The palette code table generated by the palette converter 362 and fed to the digital sequence generator 314 is that shown in FIG. 7B in this example. In this, the palette code 1 represents the grey-scale value of 4, the palette code 2 represents the grey-scale value of 1 and the palette code 3 represents the grey-scale value of 12.

FIG. 9D shows the palette codes fed from the palette converter 362 to the input 118 of the mode switch 116. In the example shown, the palette code fed to the mode switch input during the load period LO1 has a value of 1 and that fed to the mode switch input during the load period LO2 has a value of 3. The control signal MODE in its 1 state causes the mode switch 116 to connect the input 118 to the column bus 120. This feeds the palette code to the input of the N-bit register 102.

The control signal WRITE asserted during each load period, as shown in FIG. 9E, writes the palette code at the input of the N-bit register 102 into the N-bit register. The palette code thus written into the N-bit register remains stored, and is also present on the output of the N-bit register, until the control signal WRITE is next asserted. The palette code on the output of the N-bit register, and fed to the input 105 of the comparator 104, is shown in FIG. 9F.

At the end of the load period LO1, the reset control signal RS is asserted, as shown in FIG. 9G. The reset control signal sets the pixel drive signal output by the comparator 104 to its 0 state, as shown in FIG. 9J. The pixel drive signal in its 0 state applied to the pixel electrode 112 sets the pixel 110 to its ON state in which it is bright. The reset control signal sets the output of the latch 108 to its 0 state irrespective of the state of the data input 109 of the latch.

Also at the end of the load period LO, the control signal MODE changes to its 0 state, which indicates the start of the display period DI1. The clock cycles in each display period are numbered from 0 to 15 in FIG. 9A. These clock cycles indicate the 16 possible temporal points at which the pixel drive signal can change state. In a display based on a liquid crystal material, the 0 state of the control signal MODE additionally turns the light illuminating the display ON, as shown in FIG. 9K.

The change in state of the control signal MODE also causes the digital sequence generator 314 to begin generating the digital sequence composed of $2^M$, i.e., 16 in this example, P-bit words, as shown in FIG. 9H. In the example shown, the initial words of the digital sequence are the reserved palette code 0. At clock cycle 1 of the display period, the words of the digital sequence change to 2, since the palette code 2 represents a grey-scale value of 1. At clock cycle 4, the words of the digital sequence change to 1, since the palette code 1 represents a grey-scale value of 4. Finally, at clock cycle 12, the words of the digital sequence change to 3, since the palette code 3 represents a grey-scale value of 12. The words of the digital sequence remain 3 for the remainder of the sequence.

Finally, the change in state of the control signal MODE changes the state of the mode switch 116 to one in which the mode switch connects the output of the digital sequence generator 314 to the column bus 120. This feeds the digital sequence to the input 107 of the comparator 104.

In the display period DI1, each cycle of the clock signal CLOCK advances the digital sequence generated by the digital sequence generator 314 by one word, as shown in FIG. 9H. The word may be the same as the previous word, but at clock cycles 1, 4 and 12, the word changes in accordance with the palette code table provided by the palette converter 362.

The comparator 104 compares the digital values on its inputs 105 and 107, i.e., compares the palette code on the input 105 with the current P-bit word of the digital sequence on the input 107. When the digital values are different, the pixel drive signal output by the comparator remains in its 0 state, as shown in FIG. 9J. When the values correspond, as occurs when the P-bit word of the digital sequence becomes equal to the palette code of 1 at the beginning of clock cycle 4 of the display period DI1, and when it becomes equal to the palette code of 3 at the beginning of clock cycle 12 of the display period DI2, the pixel drive signal output by the comparator changes to its 1 state, as shown in FIG. 9J. This state of the pixel drive signal applied to the pixel electrode 112 sets the pixel 110 to its OFF state, as shown in FIG. 9L. In its OFF state, the pixel is dark, even though the pixel is still illuminated, as shown in FIG. 9K. The pixel drive signal output by the comparator remains in its 1 state until the comparator is once more reset by the control signal RS at the beginning of the display period DI2, also as shown in FIG. 9J. The output of the digital comparator 106 is shown in FIG. 9I.

At the end of the display period DI1, the control signal MODE reverts to its 1 state, which extinguishes the light illuminating the display element, as shown in FIG. 9K. The display was illuminated through the display period, but the pixel was in its ON state, in which it was bright, only for the number of cycles of the clock signal CLOCK equal to the grey-scale value represented by the palette code, as shown in FIG. 9L. The pixel would have a maximum apparent brightness if the pixel were in its ON state throughout the display period. However, in this example, the pixel is in its ON state, and is bright, for four out of the total of 16 clock cycles constituting the display period and is in its OFF state, and is dark, for the remaining 12 clock cycles. Thus, the pixel is bright for a fraction 4/16 of the display period, and the apparent brightness of the pixel is 4/16 of the maximum. This apparent brightness is proportional to the grey-scale value of four represented by the palette code of 1.

Operation of the digital pixel driver 300 during the second operational period OP2 is essentially similar to that described above, except that the pixel drive signal output by the comparator 104 does not revert to its 1 state, and change the pixel to its OFF state, until the beginning of the $12^{th}$ clock cycle. At the beginning of the $12^{th}$ clock cycle, the value of the words of the digital sequence changes to 3 and becomes equal to the palette code 3 loaded into the pixel driver during the load period LO2. Thus, in the operational period OP2, the pixel is in its ON state for 12 out of the total of 16 clock cycles constituting the display period and is in its OFF state for the remaining four clock cycles. The pixel is bright for a fraction 12/16 of the display period, and the apparent brightness of the pixel is 12/16 of the maximum. This apparent brightness is proportional to the grey-scale value of 12 represented by the palette code 3. The pixel 110 would therefore appear brighter in the second operational period than the first.

The pixel driver 300 sets the apparent brightness of the pixel 110 to a level proportional to the grey-scale value represented by the palette code it receives in each operational period. However, unless the palette code table provided to the digital sequence generator 314 changes, the pixel 110 can only display grey-scale levels defined by grey-scale values of 1, 4 and 12 in this example. The pixel can display a grey-scale level defined by a grey-scale value other than 1, 4 and 12 only if the palette converter 362 changes the palette code table and feeds the revised palette code table to the digital sequence generator 314. This causes the digital sequence generator to generate a different digital sequence in which the palette codes of 1, 2 and 3 are located at points temporally coincident with the duty cycles defined by different grey-scale values represented by the palette codes 1, 2 and 3.

FIG. 10 shows an exemplary embodiment of the digital sequence generator 314. The digital sequence generator is composed of the table reordering module 372, the code shift register 374, the grey-scale shift register 376, the comparator 378, the modulo-M counter 380, the selector 382 and the digital sequence shift register 384. The digital sequence generator receives a grey-scale palette code table from the palette converter 362 (FIG. 8A) at the data input 364 and derives from the palette code table a digital sequence similar to that shown in FIG. 9H. An example of the grey-scale palette code table is shown in FIG. 7B.

The re-ordering module 372 receives each new palette code table generated by the palette converter 362 (FIG. 8A) at the data input 364 and sorts the palette code table in the order of the grey-scale values. For example, the table re-ordering module would sort the exemplary palette code table shown in FIG. 7B in the following grey-scale value order: reserved, 1, 4 and 12, resulting in a palette code order of 0, 2, 1 and 3. The table re-ordering module has outputs connected to the data input of the code shift register 374 and to the data input of the grey-scale shift register 376.

The code shift register 374 is a $2^N$-stage shift register, i.e., a 4-stage shift register in this example, and the grey-scale shift register 376 is a $(2^N-1)$-stage shift register, i.e., a 3-stage shift register in this example.

The modulo-M counter 380 receives the clock signal CLOCK. Its output is connected to one input of the comparator 378. The other input of the comparator is connected to the output of the grey-scale shift register 376. The output of the comparator is connected to the clock inputs of the code shift register 374 and the grey-scale shift register 376.

The output of the code shift register 374 is connected to one input of the selector 382. The output of the selector is connected to the data input of the digital sequence shift register 384. The digital sequence shift register stores the digital sequence and is therefore preferably a $2^M$-stage shift register, i.e., a 16-stage shift register in this example. The clock input of the digital sequence shift register receives the clock signal CLOCK. The data output of the digital sequence shift register provides the output of the digital sequence generator 314, and is also connected to the other input of the selector. When the digital sequence generator 314 generates a new digital sequence in response to a new palette code table received by the table re-ordering module 372, the selector connects the data input of the digital sequence shift register to the output of the code shift register 374, and the clock signal CLOCK clocks the palette codes output by the code shift register into the digital sequence shift register. When the digital sequence shift register repetitively outputs the digital sequence stored therein, the selector connects the data output of the digital sequence shift register to the data input thereof to circulate the digital sequence through the digital sequence shift register.

The digital sequence generator 314 generates a new digital sequence in response to a new palette code table received by the table sort module 372 as follows. The table sort module sorts the new palette code table in grey-scale value order as described above. The table re-ordering module feeds the palette codes in their sort order to the code shift register 374. The code shift register stores the palette codes in their sort order and provides the first palette code, which is always 0, at its data output. The table re-ordering module also feeds the grey-scale values in their sort order to the grey-scale shift register 376, which stores the grey-scale values in their sort order. Feeding $2^N$ grey-scale values fed into the $(2^N-1)$-stage grey-scale shift register effectively discards any grey-scale value corresponding to the palette code of 0. The grey-scale shift register therefore feeds the lowest grey-scale value represented by a palette code to the comparator 378, i.e., 1 in this example. The contents of the code shift register and the grey-scale shift register after the contents of the exemplary palette code table shown in FIG. 7B have been loaded into them are shown in FIG. 10 above and below the respective shift register.

The modulo-M counter 380 is then reset and begins to count the clock signal CLOCK. The count generated by the counter is fed to one input of the comparator 378. The clock signal CLOCK repetitively clocks the palette code output by the code shift register 374 through the selector 382 into the digital sequence shift register 384. Initially the palette code on the output of the code shift register is 0.

The initial output of the code shift register 374 is repetitively clocked into the digital sequence shift register 384 until the count output by the modulo-M counter 380 becomes equal to the grey-scale value on the other input of the comparator 378. This causes the output of comparator to change state. The change in state of the comparator clocks the code shift register 374 and the grey-scale shift register 376. Clocking the shift registers changes the palette code and the grey-scale value on their respective outputs. The clock signal CLOCK repetitively clocks the new palette code output by the code shift register into the digital sequence shift register 384 until the count output by the modulo-M counter once more becomes equal to the new grey-scale value on the output of the grey-scale shift register 376. The digital sequence stored in the digital sequence shift register in this example is that shown in FIG. 9H. Once the modulo-M counter overflows, indicating that the complete digital sequence has been generated, the selector 382 changes state to allow the digital sequence to circulate through the digital sequence shift register in response to the clock signal CLOCK.

As noted above, the digital pixel driver 300 can be operated in a manner similar to that described above with reference to FIGS. 4A–4P as part of a color display element. However, the digital sequence used is similar to that shown in FIG. 9H instead of that shown in FIG. 4H. When operated in this manner, the pixel driver treats the color components independently. The palette converter 362 generates a palette code table similar to the grey-scale palette code table shown in FIG. 7B for each color component, e.g., red, blue and green, and feeds each palette code table to the digital sequence generator 314. The digital sequence generator then generates a digital sequence for each color component from the palette code table for that color component, and feeds the digital sequence for the color component to the mode switches 116-1 to 116-4 during the display period of the color component. When operated as described, a display element incorporating the digital pixel driver can render a picture using a palette composed of $(2^{3N}-3)$ different colors, where N is the number of bits in the palette codes in each of the palette code tables, and the −3 is necessitated by the reserved palette code in each palette code table. The pixel driver 300 is able to use a palette composed of $(2^{3N}-3)$ different colors, in contrast to the embodiment to be described next, because a different digital sequence is used for each color component so that each palette code can represent a different component value for each color component.

When the third embodiment 300 of the digital pixel driver is operated as just described as part of a color display element, the display element requires a non-standard color-sequential digital video signal, requires a load period for each color component, which reduces its brightness efficiency, and does not offer the option of low-power operation, as described above.

Figure 11A:
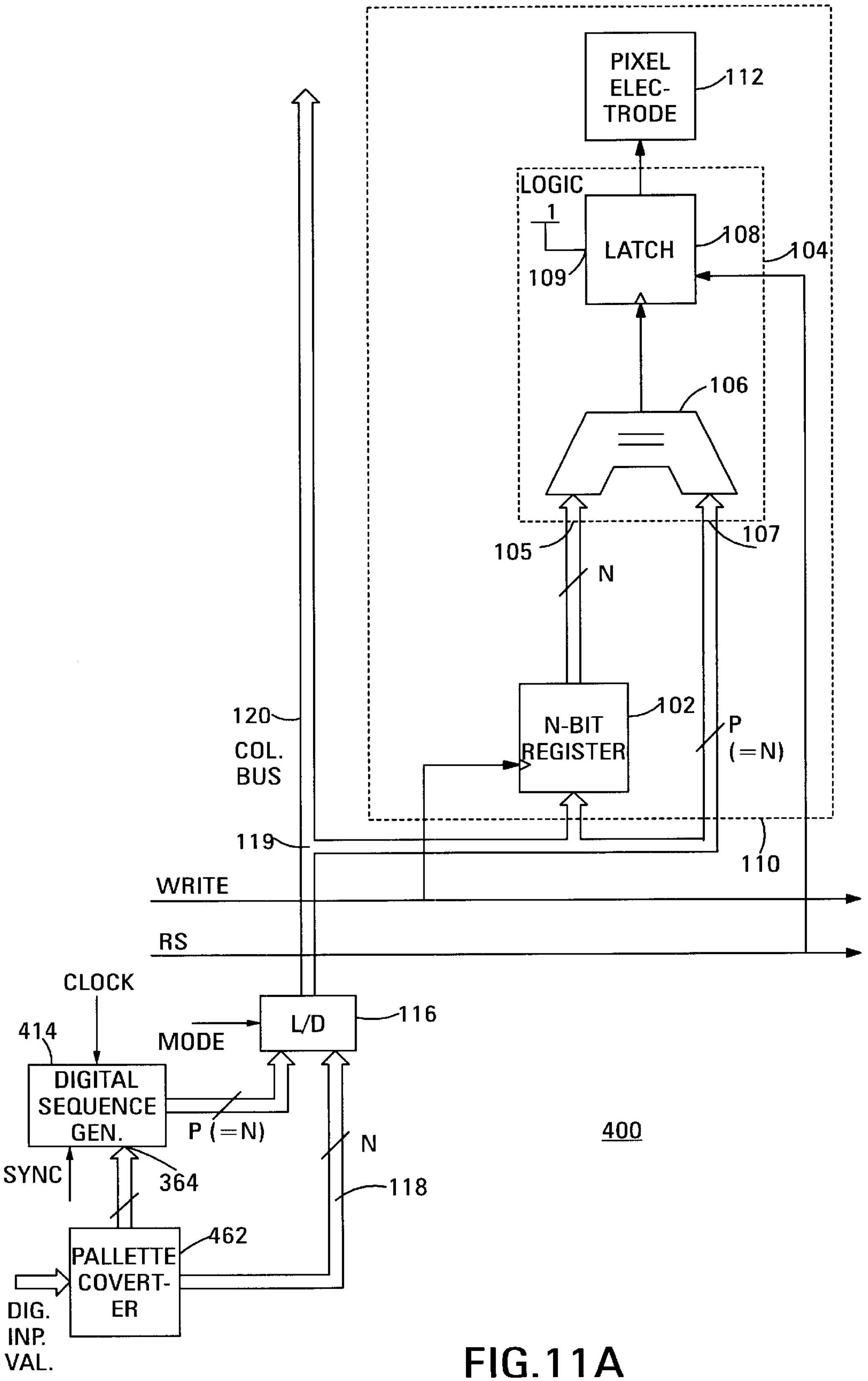
FIG. 11A is a block diagram of a fourth embodiment of a digital pixel driver according to the invention.

FIG. 11A shows a fourth embodiment 400 of the digital pixel driver according to the invention. The digital pixel driver 400 is for use in a color display element, and operates with a conventional digital video signal, has one load period per color picture displayed and offers the option of low-power operation, as described above.

The pixel driver 400 is structurally identical to the pixel driver 300 described above with reference to FIG. 11A. Elements of the pixel driver 400 that correspond to elements of the pixel driver 300 are indicated using the same reference numerals and will not be described again here. In most applications, the digital pixel driver 400 constitutes one of an array 142 of pixel drivers forming the display element 440 shown in FIG. 11B. Elements of the display element shown in FIG. 11B that correspond to elements of the display elements shown in FIGS. 3, 5B and 8B are indicated using the same reference numerals and will not be described further. When the pixel driver 400 constitutes part of the array 142, the digital sequence generator 414 and the palette converter 414 are common to all the pixel drivers in the array, and the mode switches 116-1 to 116-4 are common to all the pixel drivers in one column of the array.

In the pixel driver 400, the palette converter 462 receives the M-bit digital input value representing one pixel of a color picture and uses known techniques to select the one of the $2^N$ colors in the palette that is most appropriate to render the color represented by the digital input value. The palette converter feeds the N-bit palette code that represents the selected color to the N-bit register 102 via the mode switch 116. Palette converters are known in the art, so the palette converter 462 will not be described further.

The palette converter 462 additionally feeds the palette code table or other data that define the relationship between the colors in the palette and the N-bit palette codes that represent them, to the data input 364 of the digital sequence generator 414. In this example, the palette code table shown in FIG. 7A is fed to the digital sequence generator. In this palette code table, each palette code represents a color having red, green and blue color components. Thus, in the digital pixel driver 400 a single palette code represents a color defined by more than one component value, e.g., a red component value, a green component value and a blue component value.

In each operational period, the digital sequence generator 414 generates three digital sequences, one for each color component. In each digital sequence, each palette code in the palette code table is located at a point temporally corresponding to the duty cycle of the pixel drive signal defined by the color component value represented by the palette code. For example, assume that the digital input value is a 12-bit word, i.e., M=12. Of the 12 bits, a set of Q bits, four in this example, is allocated to each color component value so that the grey scale of each color component has 16 levels. Also assume that the palette code is a 2-bit word, i.e., N=2, so that the palette includes three colors each defined by three 4-bit color component values. The fourth color in the palette cannot be used, since one of the four palette codes is reserved, as described above. The three colors, each having three color component values $a_r$, $a_g$, $a_b$; $b_r$, $b_g$, $b_b$ and $c_r$, $c_g$, $c_b$ each in the range from 0 to 15, are represented by the palette codes of 1, 2 and 3, respectively. Since Q=4, each pixel drive signal generated by the pixel driver 400 can have one of $2^Q$=16 discrete duty cycles, and can change state at one of 16 discrete temporal points in the display period. The temporal points correspond to the cycles of the clock signal CLOCK, which are preferably equal to 1/16 of the display period. In the red display period, the digital sequence generator generates a first digital sequence in which the palette codes 1, 2 and 3 are located at points $a_r$ clock cycles, $b_r$ clock cycles and $c_r$ clock cycles, respectively, from the start of the red display period. Then, in the green display period, the digital sequence generator generates a second digital sequence in which the palette codes 1, 2 and 3 are located in at points $a_g$ clock cycles, $b_g$ clock cycles and $c_g$ clock cycles, respectively, from the start of the green display period. Finally, in the blue display period, the digital sequence generator generates a third digital sequence in which the palette codes 1, 2 and 3 are located at points $a_b$ clock cycles, $b_b$ clock cycles and $c_b$ clock cycles, respectively, from the start of the blue display period. The digital sequences usually differ from one another.

Operation of the fourth embodiment 400 of the pixel driver according to the invention in the display element 440 that includes the array 142 of pixel drivers will be described next with reference to FIGS. 11A, 11B and 12A–12P. Operation of the pixel driver to set the pixel 110 to the color represented by the palette code 2 in the palette code table shown in FIG. 7A will be described.

Figures 12A, 12B, 12C, 12D, 12E, 12F, 12G, 12H, 12I, 12J, 12K, 12L, 12M, 12N, 12O, 12P:
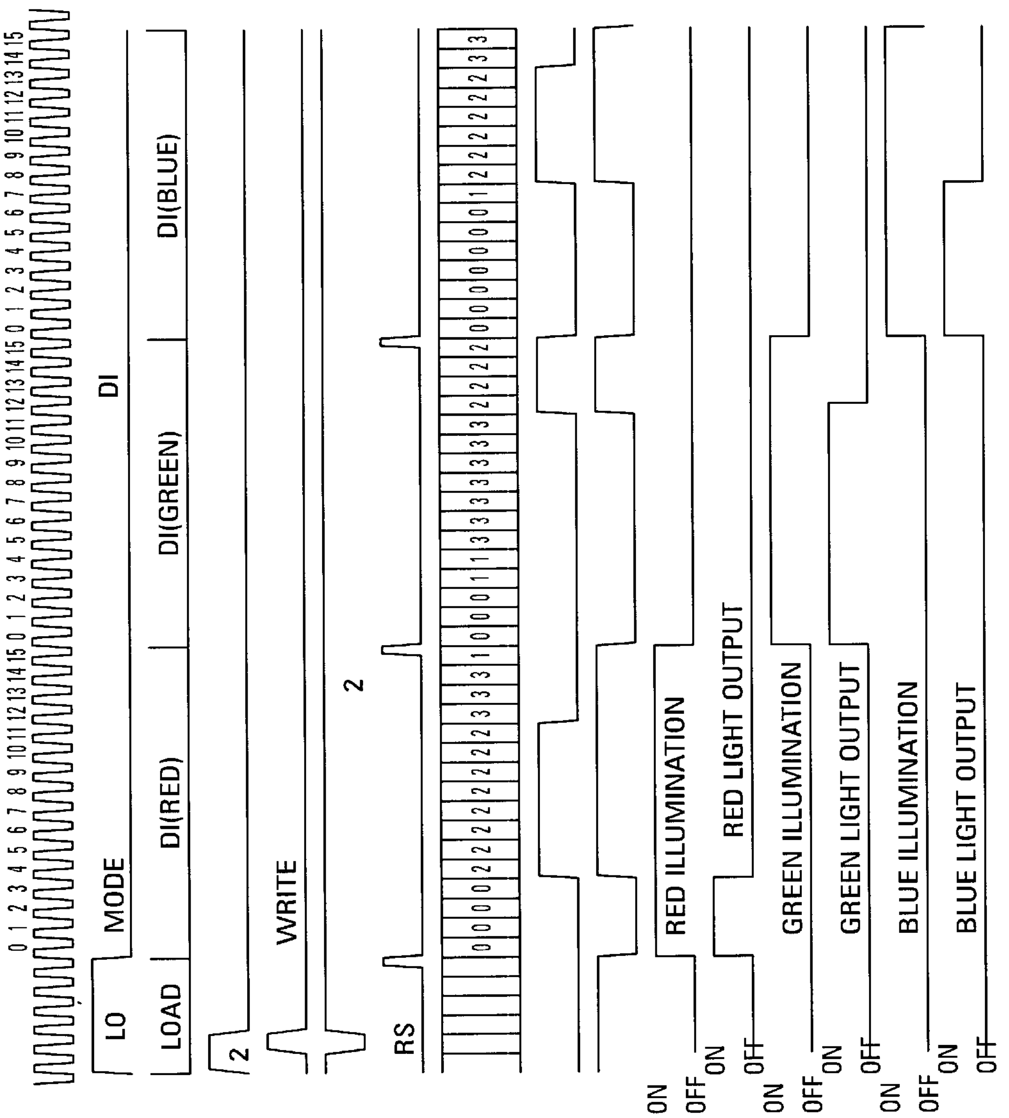
FIGS. 12A–12P illustrate the operation of a display element incorporating the fourth embodiment of the digital pixel driver in response to a single digital input value representing color components to display one color picture.

FIG. 12A shows the clock signal CLOCK. The clock cycles in each of the red, green and blue display periods, shown in FIG. 12C, are numbered. FIG. 12B shows the control signal MODE.

Figure 11B:
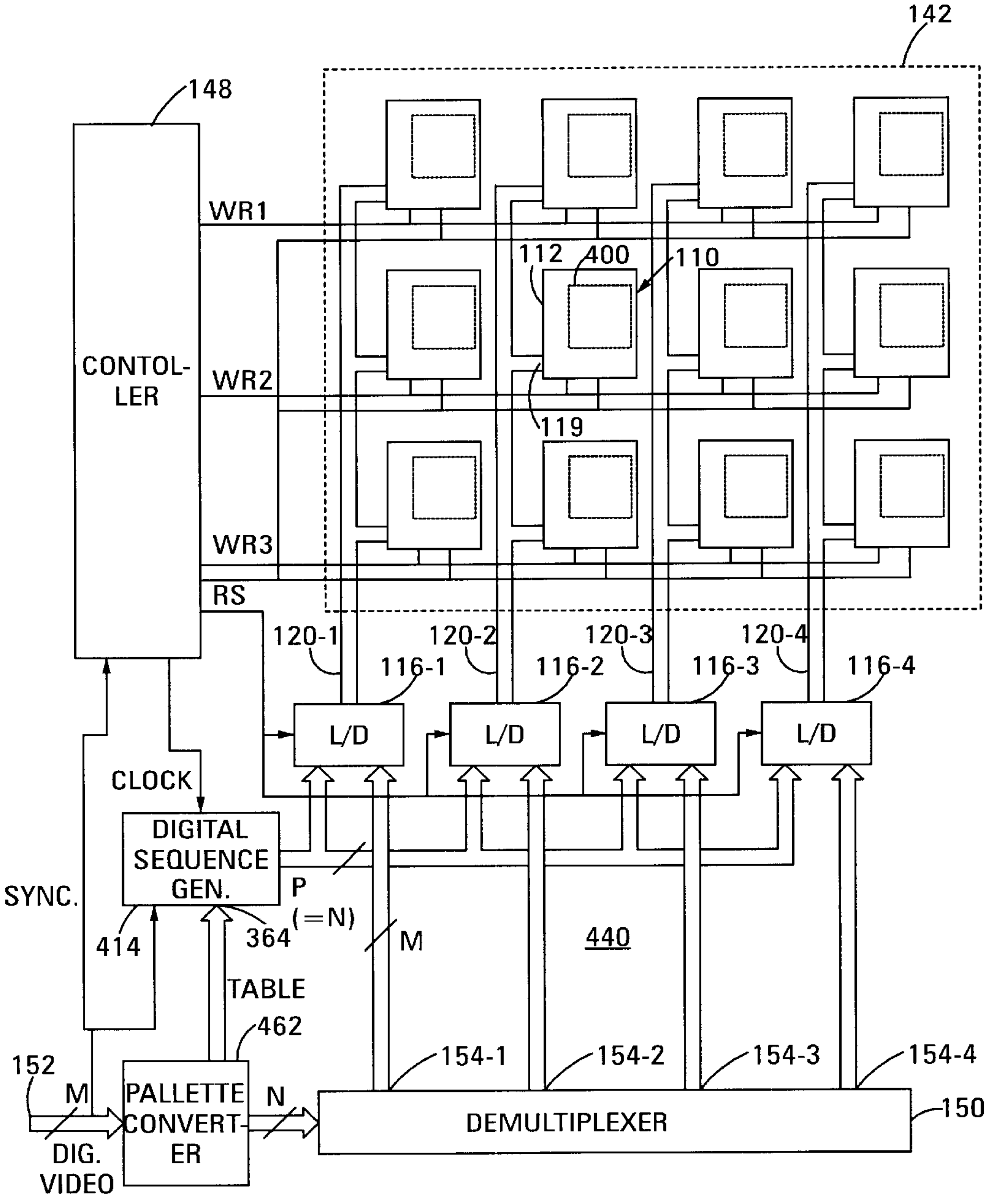
FIG. 11B is a block diagram of a display element that includes a highly-simplified array 4×3 pixels each incorporating the fourth embodiment of the digital pixel driver according to the invention.

Before or during the load period LO, the palette converter 462 receives the M-bit digital input value and determines the palette code that represents the M-bit digital input value. Then, during the load period LO, all N bits of the N-bit (N=2 in this example) palette code that represents the apparent brightness of the pixel in the red, the green and the blue are loaded into the pixel driver 400. When the pixel driver 400 is a member of the array 142 of pixel drivers, as shown in FIG. 11B, palette codes representing the entire picture are loaded into the respective pixel drivers in three write operations in response to the write control signals WR1, WR2 and WR3 in a manner similar to that shown in FIGS. 4D, 4E and 4F.

The load period LO is followed by three display periods, namely, a red display period DI(RED), a green display period DI(GREEN) and a blue display period DI(BLUE), as shown in FIG. 12C.

FIG. 12D shows the palette code fed from the palette converter 462 to the input of the mode switch 116. In the example shown, the palette code fed to the input during the load period LO has a value of 2. The control signal MODE in its 1 state causes the mode switch 116 to connect the input 118 to the column bus 120, which feeds the palette code from the input 118 to the input of the N-bit register 102.

The control signal WRITE asserted during the load period LO, as shown in FIG. 12E, writes the palette code at the input of the N-bit register 102 into the N-bit register. The palette code thus written into the N-bit register remains stored, and is also present on the output of the N-bit register, until the control signal WRITE is next asserted. The palette code at the output of the N-bit register, and fed to the input 105 of the comparator 104, is shown in FIG. 12F. The palette code remains at the output of the N-bit register through the three display periods shown.

The control signal RS is asserted at the beginning of each of the display periods DI(RED), DI(GREEN) and DI(BLUE) to reset the output of the pixel driver 400 to its 0 state, as shown in FIG. 12G. The 0 state of the pixel drive signal sets the pixel to its ON state in which it generates, transmits, reflects or otherwise controls light so that it is bright.

The digital sequence generator 414 generates a different digital sequence in each of the display periods DI(RED), DI(GREEN) and DI(BLUE), as shown in FIG. 12H. The digital sequences will be called the red, green and blue digital sequences, respectively. The digital sequence generated in each display period depends on the component values represented by the palette codes in the display period. In the red display period, the palette codes 1, 2 and 3 represent the red component values 15, 4 and 12, respectively. The red digital sequence starts with 0s. At clock cycle 4, the red digital sequence changes to 2, which is the palette code that represents a red component value of 4. At clock cycle 12, the red digital sequence changes to 3, which is the palette code that represents a red component value of 12. Finally, at clock cycle 15, the red digital sequence changes to 1, which is the palette code that represents a red component value of 15.

In the green display period, the palette codes 1, 2 and 3 represent the green component values 3, 12 and 5, respectively. The green digital sequence starts with 0s. At clock cycle 3, the green digital sequence changes to 1, which is the palette code that represents a green component value of 3. At clock cycle 5, the green digital sequence changes to 3, which is the palette code that represents a green component value of 5. Finally, at clock cycle 12, the green digital sequence changes to 2, which is the palette code that represents a green component value of 12.

This palette shown in FIG. 7A includes a conflict in its blue component values. The colors represented by the palette codes 1 and 2 are different, but have the same blue component value. The blue digital sequence generated in response to the blue component of the palette cannot include both palette codes at the same point in the digital sequence. In the blue digital sequence illustrated in FIG. 12H, the conflict is resolved by increasing the value of the blue component value represented by the palette code 2 by one least-significant bit, i.e., from 7 to 8. Other ways of preventing or resolving palette conflicts will be described below.

In the blue display period, the palette codes 1, 2 and 3 represent the blue component values 7, 7 and 14, respectively, but the conflict between the two blue component values of 7 is resolved by increasing the blue component of the color represented by the palette code of 2 from 7 to 8. The blue digital sequence starts with 0s. At clock cycle 7, the blue digital sequence changes to 1, which is the palette code that represents a blue component value of 7. At clock cycle 8, the blue digital sequence changes to 2, which is the palette code that represents a blue component value of 8, as modified to resolve the conflict. Finally, at clock cycle 14, the blue digital sequence changes to 3 which is the palette code that represents a blue component value of 14.

The output of the digital comparator 106 is shown in FIG. 12I, and the pixel drive signal output by the comparator 104 is shown in FIG. 12J.

At the end of the load period LO, the control signal RS is asserted to reset the latch 108, as shown in FIG. 12G. This sets the pixel drive signal output by the pixel driver 400 to its 0 state, which the beginning of the red display period DI(RED). The digital sequence generator 414 generates the red digital sequence during the red display period, as shown in FIG. 12H. The comparator 104 compares the palette code output by the N-bit register 102 with the red digital sequence. In this example, the red component represented by the palette code of 2 has a value of four. Consequently, the output of the digital comparator 106 and the pixel drive signal applied to the pixel electrode change state during the fourth clock cycle of the red display period, as shown in FIGS. 12I and 12J, respectively. During the red display period, the display element generates, is illuminated with, or otherwise controls red light. For example, the red illumination applied to the display element when the display element includes a liquid-crystal electro-optical transducer is shown in FIG. 12K. The resulting red light output by the pixel 110 is shown in FIG. 12L.

At the end of the red digital sequence, the control signal RS is again asserted to reset the latch 108, which resets the pixel drive signal output by the pixel driver 400 to its 0 state, which marks the beginning of the green display period DI(GREEN). The digital sequence generator 414 generates the green digital sequence during the green display period, as shown in FIG. 12H. The comparator 104 compares the palette code output by the N-bit register 102 with the green digital sequence. In this example, the green component represented by the palette code of 2 has a value of 12. Consequently, the output of the digital comparator 106 and the pixel drive signal applied to the pixel electrode 112 change state during the $12^{th}$ clock cycle of the green display period as shown in FIGS. 12I and 12J, respectively. During the green display period, the display element generates, is illuminated with, or otherwise controls green light. For example, the green illumination applied to the display element when the display element includes a liquid-crystal electro-optical transducer is shown in FIG. 12M. The resulting green light output by the pixel 110 is shown in FIG. 12N.

Finally, at the end of the green digital sequence, the control signal RS is again asserted to reset the latch 108, which returns the output of the pixel driver 400 to its reset state. This marks the beginning of the blue display period DI(BLUE). The digital sequence generator 414 generates the blue digital sequence during the blue display period, as shown in FIG. 12H. The comparator compares the palette code with the blue digital sequence. In this example, the blue component represented by the palette code of 2 has a value of eight. Consequently, the output of the digital comparator 106 and the pixel drive signal applied to the pixel electrode 112 change state during the eighth clock cycle of the blue display period, as shown in FIGS. 12I and 12J, respectively. During the blue display period, the display element generates, is illuminated with, or otherwise controls blue light. For example, the blue illumination applied to the display element when the display element includes a liquid-crystal electro-optical transducer is shown in FIG. 120. The resulting blue light output by the pixel 110 is shown in FIG. 12P.

Thus, the digital pixel driver 400 sequentially defines the apparent brightness of the pixel 110 in red, green and blue light, and, hence the apparent saturation and hue of the pixel, in response to the palette code that represents the digital input value.

Figure 13:
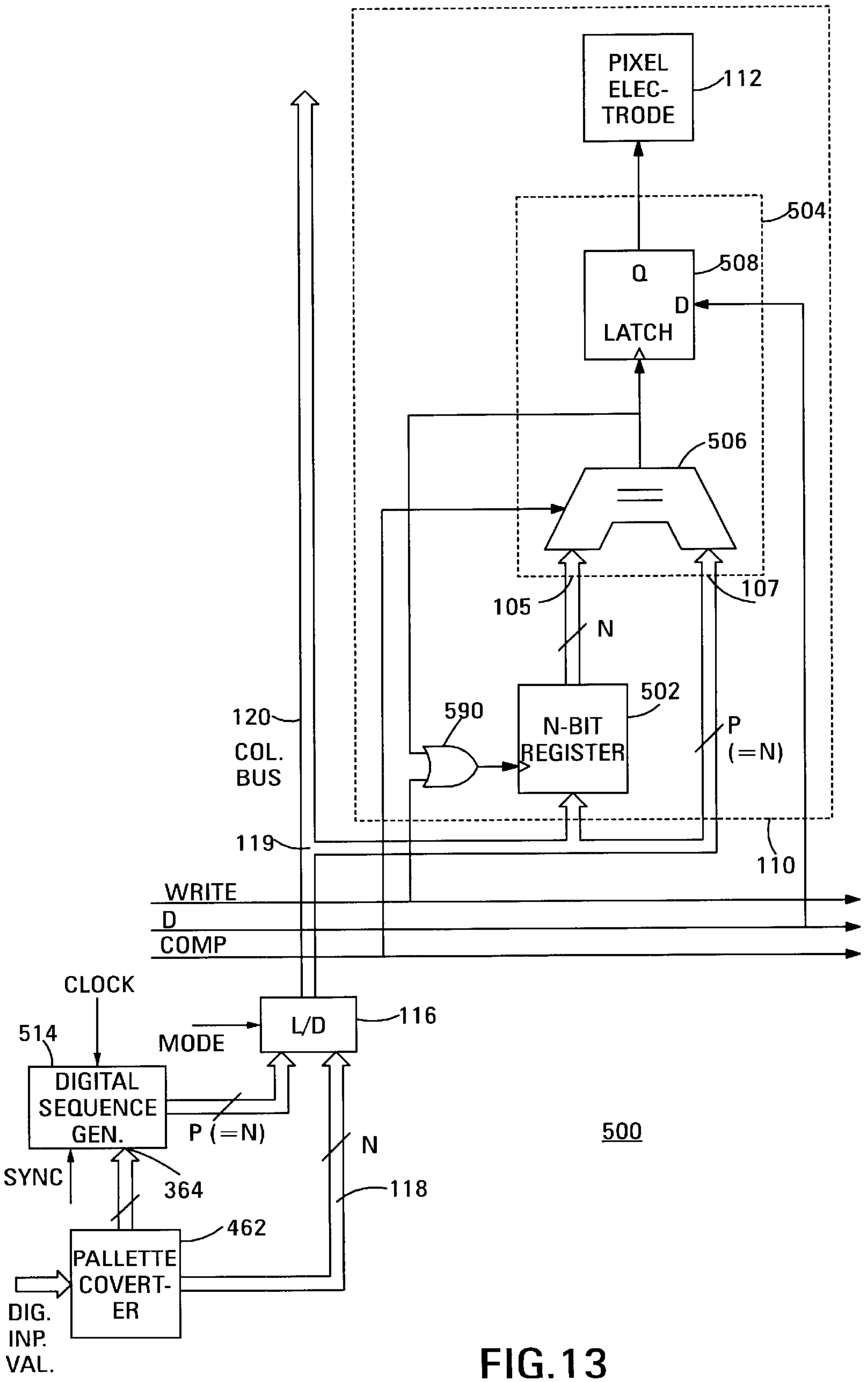
FIG. 13 is a block diagram of a fifth embodiment of a digital pixel driver according to the invention.

FIG. 13 shows a fifth embodiment 500 of the digital pixel driver according to the invention. The digital pixel driver 500 is for use in a color display element, operates with a conventional digital video signal, has one load period per color picture displayed, and offers the option of low-power operation. In the pixel driver 500, the N-bit register 502 of the digital pixel driver 500 employs dynamic memory elements, which reduces the size of the portion of the pixel driver resident in the pixel 110 compared with an embodiment that employs static memory elements. In the comparator 504 of the pixel driver 500, the clocked digital comparator 506 that operates in response to the control signal COMP is used as the digital comparator and the D-type latch 508 that operates in response to the data signal D is used as the latch. The clocked digital comparator prevents false states in the digital sequence from causing errors in the pixel drive signal and better controls the timing of the pixel drive signal. The D-type latch and the data signal D enable the pixel driver 500 to generate pixel drive signals suitable for driving a display element having a ferro-electric liquid crystal material as its electro-optical transducer. Ferro-electric liquid crystal materials and other materials suitable for use as the electro-optical transducer need DC balancing, i.e., they need to be driven so that the voltage applied by the pixel electrode 112 to the material has an average value of zero. For example, in the display element shown in FIG. 3B, the average voltage applied between the pixel electrode 112 and the common electrode 147 should have an average value of zero.

The digital pixel driver 500 generates pixel drive signals that apply an average voltage of zero to the electro-optical transducer by dividing each display period into an illumination period followed by a balance period of equal temporal duration. In the illumination period, the pixel driver generates a first pixel drive signal whose duty cycle is defined by the digital input value or a palette code derived from the digital input value. In the following balance period, the pixel driver generates a second pixel drive signal whose duty cycle is complementary to that of the first pixel drive signal, i.e., the second pixel drive signal is in the 0 state for a time equal to the time that the first pixel drive signal was in the 1 state, and is in the 1 state for a time equal to the time that the first pixel drive signal was in the 0 state. To prevent the eye from averaging the two apparent brightnesses of the pixel resulting from the two successive complementary pixel drive signals to an apparent brightness that is independent of the digital input value, the display element incorporating the pixel driver is illuminated, or otherwise controls or generates light, only during the illumination period.

The pixel driver 500 is structurally similar to the pixel driver 400 described above with reference to FIG. 11A. Elements of the pixel driver 500 that correspond to elements of the pixel drivers 100, 200, 300 and 400 are indicated using the same reference numerals and will not be described again here. The pixel driver 500 is based on the pixel driver 400 shown in FIG. 11A. The pixel drivers 100, 200 and 300 can be similarly modified to enable them to incorporate dynamic memory elements or to drive electro-optical transducers that need DC balancing, or both. Moreover, the clocked digital comparator 506 and its control signal COMP can be incorporated into the pixel drivers 100, 200, 300 and 400 independently of the other changes.

Figures 14A, 14B, 14C, 14D, 14E, 14F, 14G, 14H, 14I, 14J, 14K, 14L, 14M, 14N, 14O:
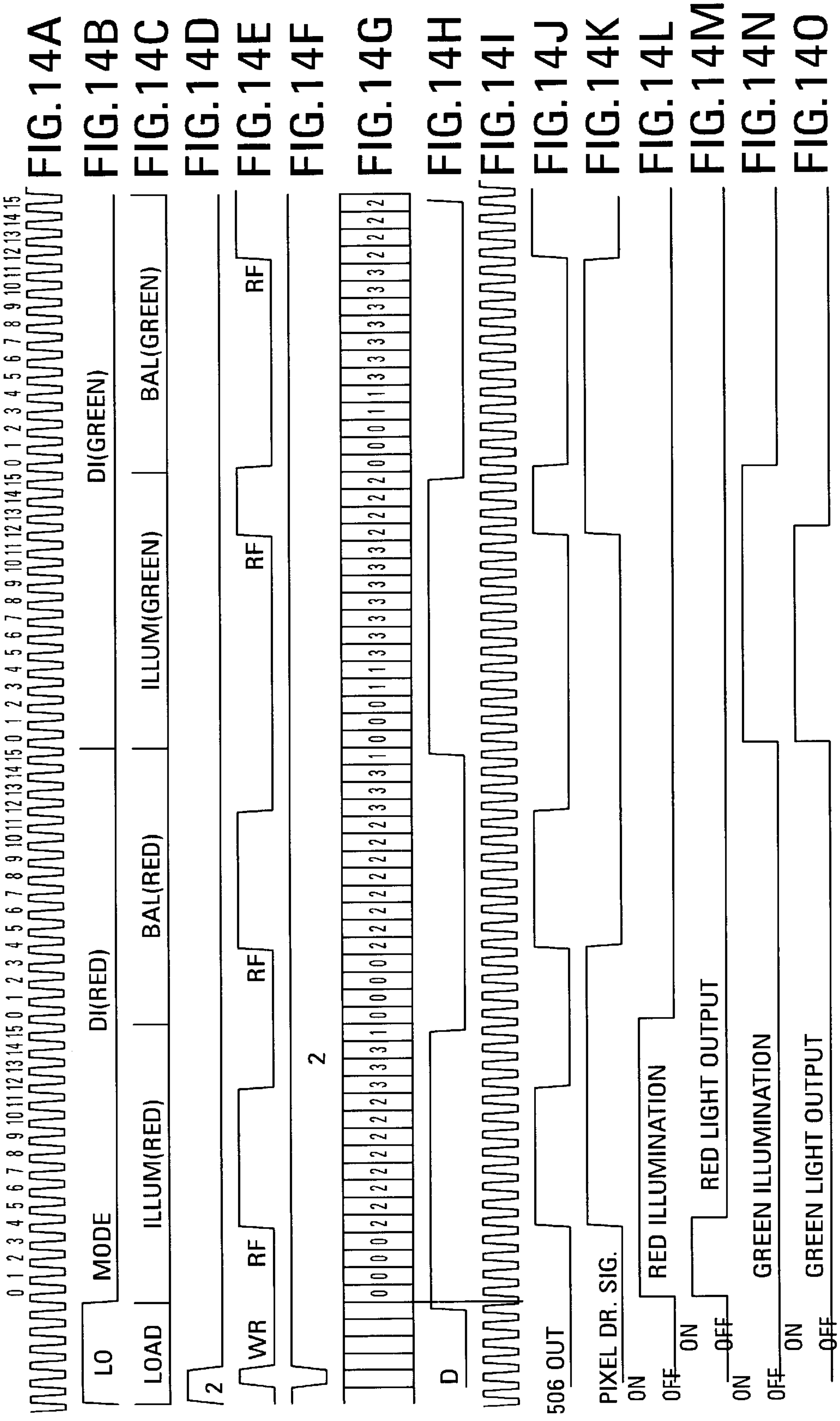
FIGS. 14A–14O illustrate the operation of a display element incorporating the fifth embodiment of the digital pixel driver in response to a single digital input value representing color components to display ⅔ of one color picture using an electro-optical transducer that requires DC balancing.

In most applications, the digital pixel driver 500 constitutes one of an array 142 of pixel drivers similar to that shown in FIG. 11B. When the pixel driver 500 constitutes part of an array, the digital sequence generator 414 and the palette converter 462 are common to all the pixel drivers in the array, and the mode switches 116-1 to 116-4 are common to all the pixel drivers in one column of the array. The data signal D and the control signal COMP are generated by a controller similar to the controller 148 shown in FIG. 11B. Circuits for generating suitable signals are known in the art and will therefore not be described here. The data signal D will be described below with reference to FIG. 14H. The control signal COMP, shown in FIG. 14I, which will be described below, has a frequency equal to that of the clock signal CLOCK. The control signal COMP is delayed relative to the clock signal CLOCK by a time greater than the maximum settling time of the signals on the inputs 105 and 107 of the comparator. A delay of ¼ of the period of the clock signal CLOCK is shown in FIG. 14I to enable the delay to be shown. In practical embodiments, the delay is substantially smaller than that shown.

To enable the N-bit register 502 to incorporate dynamic memory elements, which need periodic refreshing, the portion of the pixel driver 500 resident in the pixel 110 includes a refresh path that includes the OR gate 590. One input of the OR gate is connected to receive the WRITE control signal and the other input of the OR gate is connected to the output of the clocked digital comparator 506 in the comparator 504. The output of the OR gate is connected to the WRITE input of the N-bit register.

The OR gate 590 allows a positive-going transition of either the control signal WRITE or the output of the comparator 504 to cause a digital value at the input of the N-bit register 502 to be written into the register. During each load period LO, a positive-going transition of the WRITE control signal passes through the OR gate to cause the digital input value present at the input of the N-bit register to be written into the register. In addition, during each display period, a positive-going transition resulting from the change in state of the output of the digital comparator 106 passes through the OR gate to cause a word of the digital sequence at the input of the N-bit register to be written into the register.

The output of the clocked digital comparator 506 changes state on the next positive-going transition of the control signal COMP following the occurrence in the digital sequence of a word equal to the palette code or the digital input value stored in the N-bit register 502. Accordingly, when the output of the clocked digital comparator changes state, the word of the digital sequence on the input to the N-bit register is equal to the palette code or digital input value stored in the N-bit register. Thus, the change in state of the output of the clocked digital comparator causes the word of the digital sequence at the input to the N-bit register to be written into the N-bit register. The word of the digital sequence replaces the equal-valued palette code or digital input value previously stored in the N-bit register, and effectively refreshes the palette code or digital input value stored in the N-bit register.

This occurs twice per display period in the example shown. In a version of the refresh path applied to the pixel driver 200 shown in FIG. 5A, the part of the digital input value that defines each color component is refreshed twice in the display period for that color component. Thus, the complete digital input value is refreshed once per operational period.

In the pixel driver 500, the D-type latch 508 or a similar device is employed as the latch in the comparator 504 to enable the comparator to generate two complementary pixel drive signals per display period. Such pixel drive signals enable the pixel to be DC balanced. In addition, the digital sequence generator is modified to generate two identical digital sequences per display period. The Q output of the D-type latch is connected to the pixel electrode 112 and the data input D of the D-type latch is connected to receive the data signal D. The data signal D is generated to be in a logical 1 state during the illumination period of each display period, and to be in a logical 0 state during the balance period of each display period. The clock input of the D-type latch is connected to receive the output of the clocked digital comparator 506.

The clocked digital comparator 506 operates in response to the control signal COMP. When the digital values on the inputs 105 and 107 of the comparator 504 become equal, the output of the clocked digital comparator does not change state until the control signal COMP next changes state. As noted above, the delay between the digital values becoming equal and the control signal COMP next changing state is a small fraction of the period of the clock signal CLOCK.

Operation of the pixel driver 500 during the load period LO and the following red display period DI(RED) and green display period DI(GREEN) will be described with reference to FIGS. 13 and 14A–14O. Operation during the following blue display period is similar, and has been omitted to simplify the drawing. Operation of the pixel driver to set the pixel 110 to the color represented by the palette code 2 in the palette code table shown in FIG. 7A will be described.

FIG. 14A shows the clock signal CLOCK. The clock cycles in each of the red and green display periods, shown in FIG. 14B, are numbered. FIG. 14B shows the control signal MODE, as described above with reference to FIG. 12B. When the mode control signal is in its 1 state, the palette code that represents the M-bit digital input value is written into the N-bit register 102; The mode control signal changes to its 0 state and remains there during the following display periods. FIG. 14C shows the how the red and green display periods are each divided into an illumination period and a balance period of equal durations.

FIGS. 14D–14F illustrate how the palette code 2 is stored in the N-bit register 502 in response to the edge marked WR of the control signal WRITE in the load period LO in a manner similar to that described above with reference to FIGS. 12D–12F. FIG. 14E, which shows the signal on the output of the OR gate 590 fed to the WRITE input of the N-bit register 502, also shows how the palette code is refreshed during the illumination and balance periods of each display period in response to the transition marked RF of the output of the clocked digital comparator 506.

FIG. 14G shows the digital sequences generated by the digital sequence generator 414 during the display periods DI(RED) and DI(GREEN). The digital sequence generator generates the red digital sequence twice, once during the illumination period and once during the balance period, and similarly generates the green digital sequence twice. As described above, the digital sequence generated in each of the display periods depends on the component values represented by the palette codes in the display period.

FIG. 14H shows the data signal D fed to the data input D of the D-type latch 508. The data signal changes to its 1 state shortly before the start of the digital sequence of each of the red and green illumination periods, and changes to its 0 state shortly before the start of the digital sequence of each of the red and green balance periods.

FIG. 14I shows the control signal COMP, described above.

FIG. 14J shows the output of the clocked digital comparator 506. At the end of the load period LO, the control signal MODE changes state, marking the start of the red illumination period ILLUM(RED). The output of the clocked digital comparator, shown in FIG. 14J and the first pixel drive signal, shown in FIG. 14K, output by the pixel driver 500 are both in the 0 states to which they were set during the previous balance period (not shown). Also at the end of the load period, and in synchronism with the clock signal CLOCK, the digital sequence generator 514 starts to generate the red digital sequence, as shown in FIG. 14G. Finally, at the end of the load period LO, the data signal D changes to its 1 state, as shown in FIG. 14H.

The 0 state of the pixel drive signal sets the pixel to its ON state. However, no light is emitted until the pixel is illuminated. The pixel illumination is synchronized to the control signal COMP rather than the clock signal CLOCK, as shown in FIG. 14L. This prevents the pixel emitting a short pulse of light when the palette code is equal to the first value of the digital sequence. No light should be emitted in this instance. The red illumination turns on in response to the control signal COMP, and, since the pixel is already in its ON state, the pixel emits red light, as shown in FIG. 14M.

As the digital sequence progresses through the red illumination period, the clocked digital comparator 506 compares the palette code output by the N-bit register 502 with the red digital sequence. In this example, the red component represented by the palette code of 2 has a value of four. Consequently, the output of the clocked digital comparator 506 changes state in response to the change of state of the control signal COMP during the fourth clock cycle of the red illumination period, as shown in FIG. 14J. The output of the clocked digital comparator clocks the D-type latch, which transfers the 1 state of the data signal D on the D input of the latch to the Q output. As a result, the first pixel drive signal output by comparator 504 changes to its 1 state, as shown in FIG. 14K.

The 1 state of the first pixel drive signal applied to the pixel electrode 112 during clock cycles 4 through 15 of the red illumination period sets the pixel to its OFF state in which the pixel is dark, as shown in FIG. 14M.

During the red illumination period, the first pixel drive signal applied to the pixel electrode 112 was in its 0 state (pixel ON) for four clock cycles and was in its 1 state (pixel OFF) for 12 clock cycles. The first pixel drive signal is therefore asymmetrical, and the pixel is not DC balanced.

The end of the first red digital sequence marks the end of the red illumination period ILLUM(RED) and the beginning of the red balance period BAL(RED). The digital sequence generator 514 resets and generates a second red digital sequence, as shown in FIG. 14G. The data signal D changes to its 0 state, as shown in FIG. 14H. Finally, the red light illuminating the display element is extinguished in synchronism with the control signal COMP, as shown in FIG. 14M.

At the start of the red balance period, the second pixel drive signal output by the D-type latch 508 is in its 1 state, and remains in this state until the fourth clock cycle of the second red digital sequence. In the fourth clock cycle, the red digital sequence once more matches the palette code stored in the N-bit register 502. As a result, the output of the clocked digital comparator 506 changes state in response to the next change in state of the control signal COMP, as shown in FIG. 14J. This clocks the D-type latch, which transfers the 0 state of the data signal D on the D input of the latch to the Q output, as shown in FIG. 14K, and also clocks the WRITE input of the N-bit register through the OR gate 590, as shown in FIG. 14E. The change in state in the Q output of the D-type latch 508 causes the second pixel drive signal to change to its 0 state, which once more sets the pixel to its ON state. However, the pixel emits no light during the red balance period, as shown in FIG. 14M because the display element is not illuminated, as shown in FIG. 14L. The second pixel drive signal remains in its 0 state for the remainder of the red balance period BAL(RED), i.e., for clock cycles 4–15 of the second red digital sequence.

During the red balance period, the second pixel drive signal applied to the pixel electrode 112 was in its 1 state (pixel OFF) for four clock cycles and was in its 0 state (pixel ON) for 12 clock cycles. The second pixel drive signal is therefore asymmetrical, but the asymmetry is complementary to that of the first pixel drive signal applied to the pixel electrode during the red illumination period, and therefor restores the DC balance of the pixel.

Operation of the pixel driver 500 during the green display period DI(GREEN) is similar. The data signal D reverts to its 1 state at the beginning of the green illumination period, as shown in FIG. 14J. The first pixel drive signal output by the D-type latch 508 during green display period does not change state until the $12^{th}$ clock cycle of the first green digital sequence that coincides with the green illumination period ILLUM(GREEN). The first pixel drive signal then remains in its 1 state for clock cycles 12–15 of the first green digital sequence, as shown in FIG. 14K. Thus, the first pixel drive signal applied to the pixel electrode 112 during the green illumination period is asymmetrical.

The data signal D reverts to its 0 state at the beginning of the green balance period BAL(GREEN), as shown in FIG. 14J. The second pixel drive signal is in its 1 state for clock cycles 0–11 of the second green digital sequence that coincides with the green balance period. Finally, the second pixel drive signal reverts to its 0 state for clock cycles 12–15 of the second green digital sequence, as shown in FIG. 14K. The display element is only illuminated during the green illumination period, as shown in FIG. 14N. Thus, the second pixel drive signal is asymmetrical during the green balance period, but the asymmetry is complementary to that of the first pixel drive signal applied to the pixel electrode during the green illumination period, and therefore restores the DC balance of the pixel.

The DC balance of the pixel may alternatively be restored by using the comparator 104 shown in FIG. 1 instead of the comparator 504, and, during the balance period of each display period, generating a second digital sequence opposite in order to the first digital sequence generated during the corresponding illumination period. For example, in FIG. 14G, the first digital sequence of the red display period DI red changes from 0 to 2 at the beginning of the $4^{th}$ clock cycle from the beginning of the sequence, and changes from 2 to 3 at the beginning of the $12^{th}$ clock cycle from the beginning of the sequence. The corresponding second digital sequence generated during the red balance period BAL (RED) would change from 0 to 2 at the beginning of the $4^{th}$ clock cycle from the end of the sequence, and would change from 2 to 3 at the beginning of the $12^{th}$ clock cycle from the end of the sequence.

In FIGS. 12K, 12M and 12O and in others of the figures showing the operation of the embodiments of the pixel driver according to the invention, a ferroelectric liquid crystal-based display element incorporating the pixel drive circuit is shown as being illuminated for a time coincident with the digital sequence. However, in practical embodiments, the pixel drive signal output by the comparator 104 (FIG. 11A) changes state a short delay time after the digital values on the inputs 105 and 107 of the comparator become equal. The delay time of the comparator is usually short compared with the period of the clock signal CLOCK. Nevertheless, the delay time can impair the linearity of the grey scale generated by the display element and, in particular, can cause the display element to emit a short pulse of light when the digital input value is zero or the palette code represent a digital input value of zero. The short pulse of light impairs the minimum black level that can be obtained.

The embodiment shown in FIG. 13, and whose operation is shown in FIGS. 14A–14O overcomes these problems by synchronizing the illumination of the display element and the output of the clocked digital comparator 506 to the control signal COMP. Synchronizing the output of the clocked digital comparator also synchronizes the change in state of the pixel drive signal to the control signal COMP. The control signal COMP is synchronized to, but delayed slightly relative to, the clock signal CLOCK. Consequently, the pixel drive signal changes state at a fixed time relative to the clock signal CLOCK, regardless of the settling time of the inputs to the comparator 504. Using a clocked digital comparator that has a fixed delay and synchronizing the illumination and the comparator to the same control signal improves the grey-scale linearity and enables a lower black level to be obtained. In display elements based on electro-optical transducers that do not require illumination, the effect of delaying the illumination of the ferro-electric liquid-crystal based display element can be obtained by switching the voltage applied to the common electrode of the electro-optical transducer in a manner similar to the way the illumination is shown as being switched in FIGS. 14L and 14N.

The D-type latch 508 shown in FIG. 13 generates a sequence of two complementary pixel drive signals suitable for driving a pixel having a ferroelectric liquid crystal material as its electro-optical transducer. The D-type latch lacks a reset input, which saves at least one transistor in each pixel, or about one million transistors in a typical high-resolution display element. The D-type latch without a reset input can also be used in embodiments having an electro-optical transducer that does not require DC balancing, and therefore do not require a sequence of two complementary pixel drive signals, by reversing the order of the digital sequence between consecutive digital sequences. This slightly increases the complexity of the digital sequence generator, but the overall complexity of the display element is significantly reduced compared with a display element in which the latch in every pixel driver has a reset input. When overall complexity is not an important issue, a unidirectional digital sequence can be used, and the latch in each pixel driver can include a reset input.

As noted above, in the pixel drivers 400 and 500 shown in FIGS. 11A and 13, respectively, a palette in which two or more colors share a common color component value, such as the blue color component values in the palette shown in FIG. 7A, potentially causes conflicts when received by the digital sequence generator 414 or 514. One way to prevent the problem is to impose a constraint on the palette conversion processing performed by the palette converter 462 that prevents the palette conversion processing from generating a palette in which two or more colors share a common color component value.

In instances in which such a constraint is unacceptable, the digital sequence generator can be configured to perform a conflict resolution procedure. An example of a digital sequence generator 614 suitable for use as the digital sequence generators 414 and 514 will now be described with reference to FIG. 15. The digital sequence generator 614 operates in response to palette code tables of the form shown in FIG. 7A. Elements of the digital sequence generator 614 that correspond to elements of the digital sequence generator 314 shown in FIG. 10 are indicated using the same reference numerals and will not be described further.

In the digital sequence generator 614, the table re-ordering module 672 is composed of the component tables builder 692, the conflict detector 694 and the component value adjustment module 696. In the table re-ordering module 672, the component tables builder 692 receives the palette code table from the palette converter and builds from the received palette code table an individual palette code table, called a component table, for each color component. The palette code table received from the palette converter is of the form shown in FIG. 7A in which each element of the palette is defined by three color component values and is represented by a single palette code. The component tables built by the component tables builder are of the form shown in FIG. 7C, which shows the component table for the blue component as an example. The blue component table is composed of the three blue component values shown in FIG. 7A, each with its respective palette code. In the blue component table, the blue component values are sorted in the order of ascending component value. The component palette code tables for red and green are similar in structure.

The component tables builder 692 feeds each component table to the component value adjustment module 696. The component table is examined by the conflicts detector 694, which determines the duplicate component values, if any, in the component table and indicates such duplicate component values to the component value adjustment module. In response to such an indication, the component value adjustment module changes one or more of the component values by adding or subtracting one least-significant bit to them until the conflicts are eliminated. An example of the conflicts resolution provided by the table re-ordering module 672 of the digital sequence generator 614 is illustrated in the blue digital sequence shown FIG. 12H, as described above.

The component value adjustment module 696 feeds the component values constituting each component table, with their values adjusted if necessary, to the grey-scale shift register 376. The component table builder 692 feeds the corresponding palette codes to the code shift-register code shift register 374. The digital sequence 614 generator then generates a digital sequence in response to each component table in the manner described above with reference to FIG. 10.

Figure 15:
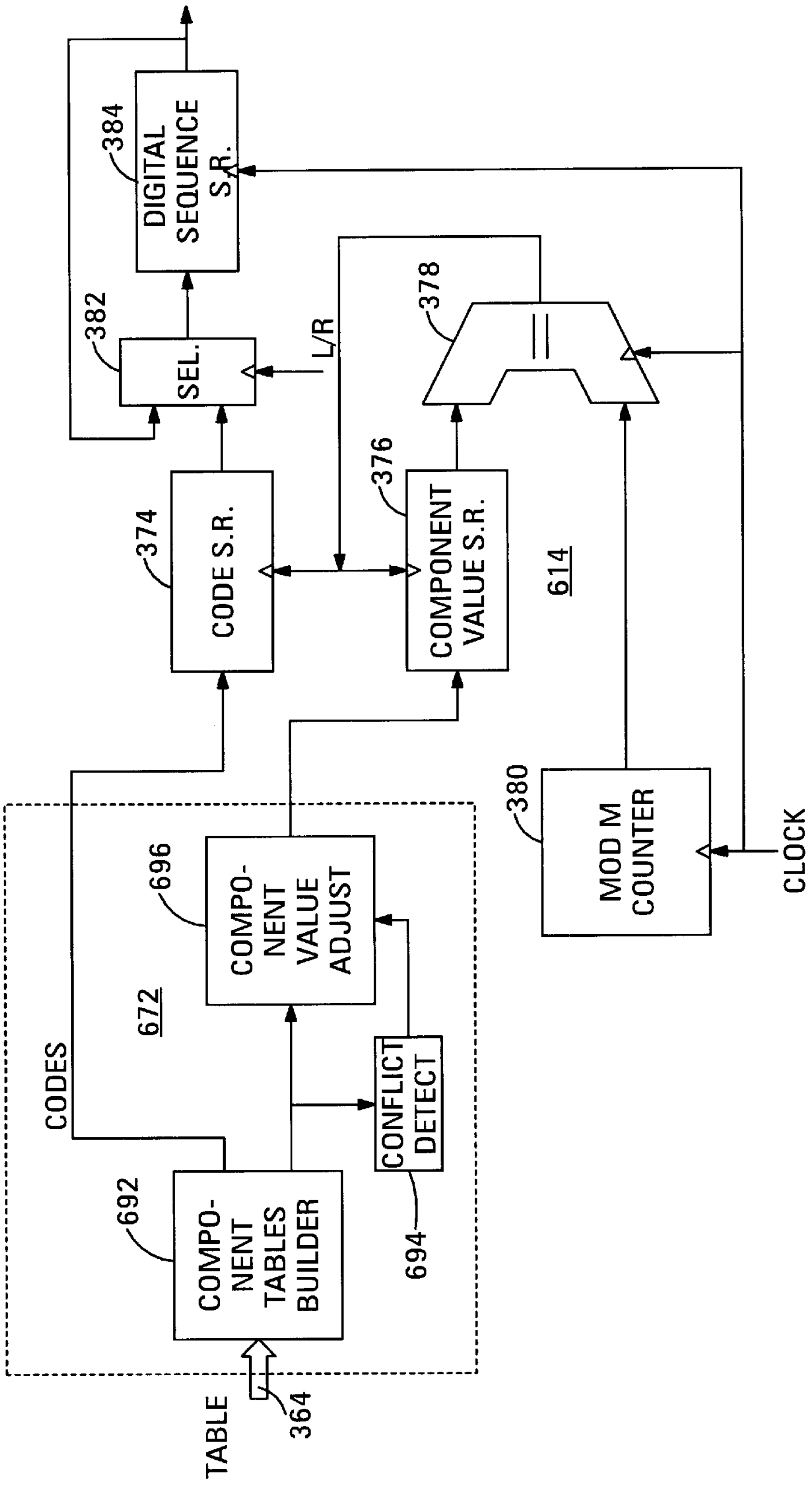
FIG. 15 is a block diagram showing a first example of a digital sequence generator suitable for use in versions of the fourth and fifth embodiments of the digital pixel driver according to the invention in which the palette converter is capable of generating palette tables that include conflicts.
Figure 16:
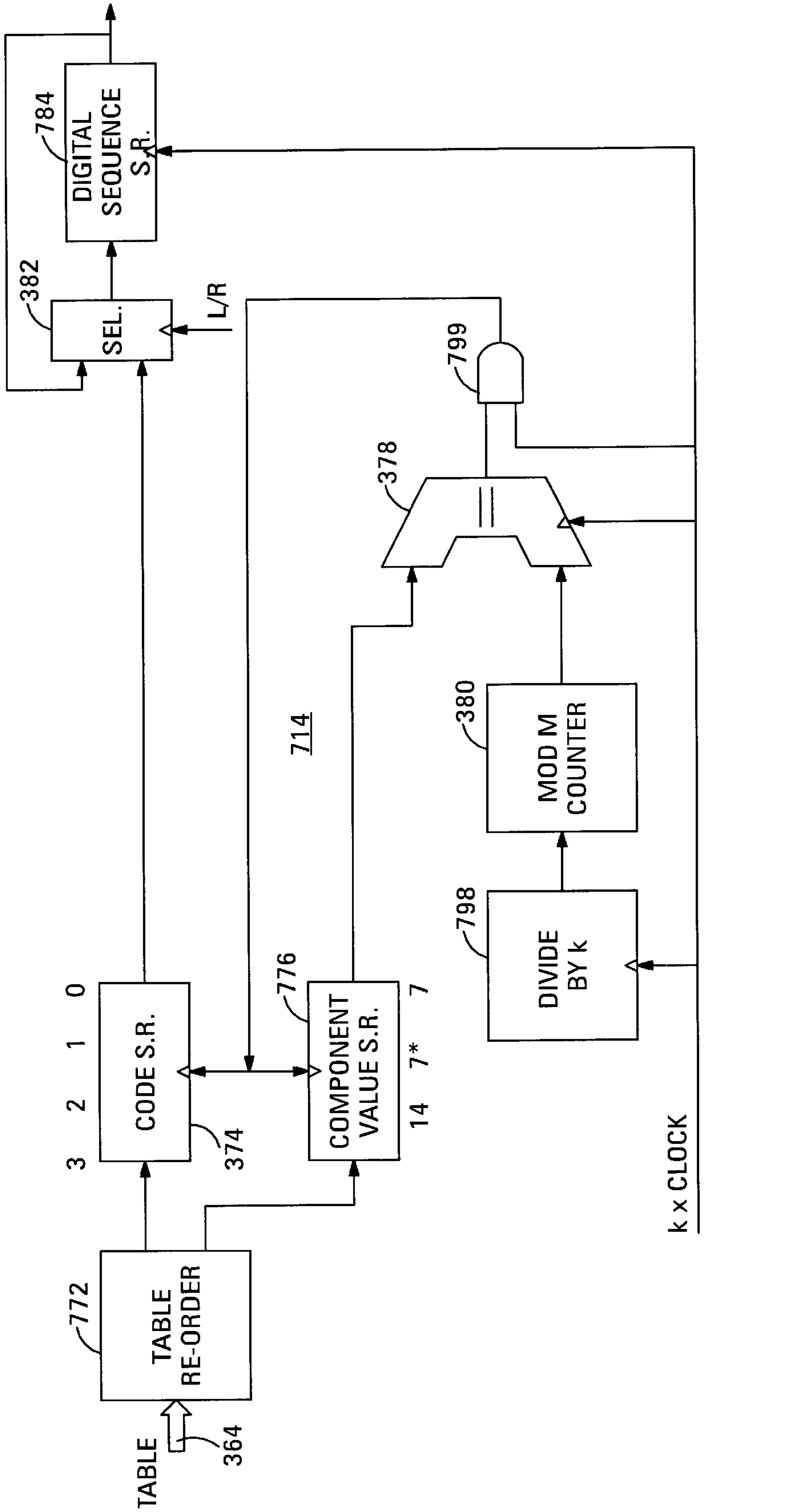
FIG. 16 is a block diagram showing a second example of a digital sequence generator suitable for use in versions of the fourth and fifth embodiments of the digital pixel driver according to the invention in which the palette converter is capable of generating palette tables that include conflicts.

The digital sequence generator shown in FIG. 15 is capable of successfully resolving conflicts in the palette code table, but may cause discernable color distortions in the process. Moreover, the colors of the palette can be such that component value adjustment module, in resolving one conflict, may create one or more other conflicts that then require resolution. This results in additional changes to the palette. FIG. 16 shows an alternative approach in which conflicts are resolved by making substantially smaller changes to the color component values.

The digital sequence generator 714 shown in FIG. 16 is based on the digital sequence generators shown in FIGS. 10 and 15. However, instead of generating a digital sequence composed of $2^M$ words, the digital sequence generator generates a digital sequence composed of k×$2^M$ words, which enables the digital sequence to accommodate the palette codes of k colors having an equal color component within one clock cycle of the clock signal CLOCK. Elements of the digital sequence generator 714 that correspond to elements of the digital sequence generators shown in FIGS. 10 and 15 are indicated using the same reference numerals and will not be described further.

The digital sequence generator 714 operates in response to the clock signal k×CLOCK, which has a clock frequency of k times the frequency of the clock signal CLOCK in the digital sequence generator shown in FIG. 10, where k is the maximum number of component value conflicts that the digital sequence generator 714 is capable of resolving. The clock signal k×CLOCK is also applied to the pixel driver that incorporates the digital sequence generator 714.

The clock signal k×CLOCK is applied to the clock inputs of the digital comparator 378, the digital sequence shift register 784 and the divide-by-k circuit 798, and to one input of the AND gate 799. The other input of the AND gate is connected to the output of the digital comparator, and the output of the AND gate is connected to the clock inputs of the code shift register 374 and the component value shift register 776. The output of the divide-by-k circuit is connected to the clock input of the modulo-M counter 308. The digital sequence shift register has k×$2^M$ stages.

The table re-ordering module 772 receives a palette code table of the form shown in FIG. 7A from the palette converter in the digital pixel driver, and generates from the palette code tables three component tables of the form shown in FIG. 7C. The table re-ordering module orders each component table in the order of ascending component value, but performs no conflicts resolution. The digital sequence generator 714 generates a different digital sequence in response to each component table, as described above.

Figures 17A, 17B, 17C, 17D, 17E, 17F, 17G:
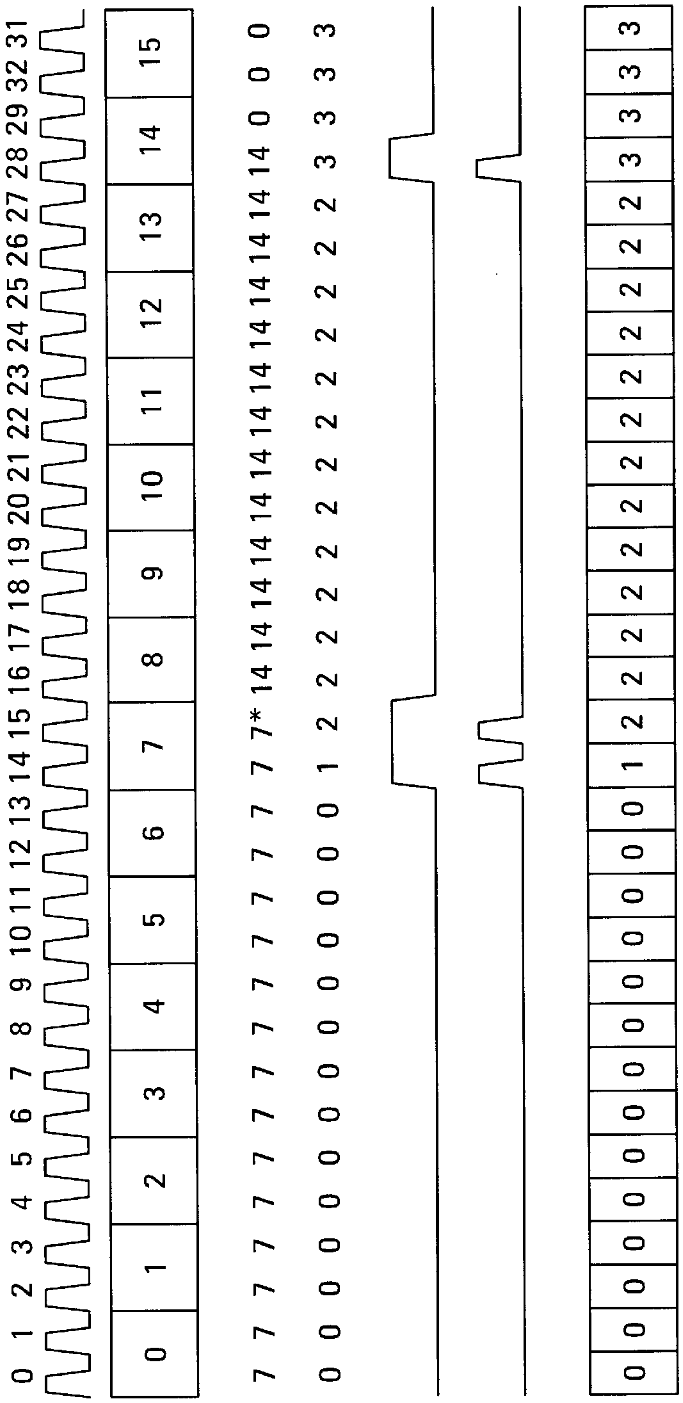
FIG. 17A–17G illustrates the operation of the example of the digital sequence generator shown in FIG. 16.

Operation of the digital sequence generator 714 to generate the blue digital sequence in response to the exemplary palette code table shown in FIG. 7A will now be described with reference to FIGS. 17A–17F. The blue component table derived by the table re-ordering module 772 from the palette code table shown in FIG. 7A is shown in FIG. 7C. It can be seen that the blue component table includes a conflict in that the blue component value 7 is represented by the two palette codes 1 and 2. The blue component value 7 represented by the palette code 2 is identified throughout by an asterisk to distinguish it from the blue component value 7, which is a component of an entirely different color, represented by the palette code 1. The palette codes stored in the code shift register 374 and the component values stored in the component value shift register 376 at the start of generating the blue digital sequence are shown in FIG. 16. Generation of the red and green digital sequences is similar, except that there are no conflicts to deal with. FIG. 17A shows the clock signal k×CLOCK. In this example, the value of k is 2, to simplify the explanation. In this embodiment, the digital sequence is generated over 32 cycles of the clock signal k×CLOCK instead of being generated over 16 cycles of the clock signal CLOCK. However, since the frequency of the clock signal k×CLOCK is twice that of the clock signal CLOCK, the temporal duration of the blue digital sequence, and, hence, the blue display period, is unchanged. The clock cycles during which the blue digital sequence is generated are numbered 0–31.

FIG. 17B shows the output of the modulo-M counter 380 fed to one input of the digital comparator 378. Since the divide-by-k circuit 798 divides the clock signal k×CLOCK by 2, the output of the counter changes states every two cycles of the clock signal.

FIGS. 17C and 17D respectively show the output of the component value shift register 376 fed to the other input of the digital comparator 378 and the output of the code shift register 374 fed to the digital sequence shift register 784 through the selector 382 in each cycle of the clock signal k×CLOCK. In each of the clock cycles 0–13, the 0 output by the code shift register is repetitively clocked into the digital sequence shift register 784 by the clock signal k×CLOCK. The digital sequence built in the digital sequence shift register as results is shown in FIG. 17G. Also, in each of the clock cycles 0– 13, the 7 output by the component value shift register is fed to the digital comparator 378, as shown in FIG. 17C. Since the output of the component value shift register matches none of the outputs of the modulo-M counter shown in FIG. 17B during the cycles 0–13, the output of the digital comparator stays in its 0 state, as shown in FIG. 17E, and the outputs of the code and component value shift registers remain unchanged, as shown in FIGS. 17C and 17D, respectively.

In clock cycle 14, the output of the modulo-M counter 380 fed to one input of the digital comparator 378 changes to 7. This matches the output of the component value shift register 376 on the other input, which causes the output of the digital comparator to change to its 1 state, as shown in FIG. 17E. The 1 state of the comparator output opens the AND gate 799. The clock signal k×CLOCK passes through the AND gate, as shown in FIG. 17F, and clocks the code and component value shift registers 374 and 376.

The clock signal k×CLOCK changes the output of the component value shift register 376 from 7 to 7*, as shown in FIG. 17C, and changes the output of the code shift register 374 from 0 to 1, as shown in FIG. 17D. The clock signal k×CLOCK clocks the new value of the code shift register output into the digital sequence shift register 784, as shown in FIG. 17G.

In clock cycle 15, the output of the modulo-M counter 380 fed to one input of the digital comparator 378 remains at 7. This matches the new output of 7* fed from the component value shift register 376 to the other input of the digital comparator. Consequently, the output of the digital comparator remains in its 1 state, as shown in FIG. 17E, which keeps the AND gate 799 open. Another cycle of the clock signal k×CLOCK passes through the AND gate, as shown in FIG. 17F, and clocks the code and component value shift registers 374 and 376.

The clock signal k×CLOCK changes the output of the component value shift register 376 from 7* to 14, as shown in FIG. 17C, and changes the output of the code shift register 374 from 1 to 2, as shown in FIG. 17D. The clock signal k×CLOCK clocks the new value of the code shift register output into the digital sequence shift register 784, as shown in FIG. 7G.

Thus, the digital sequence generator 714 generates a digital sequence in which the palette codes that represent the colors that each have a blue: component value of 7 both appear in the period during which the output of the modulo-M counter is 7. The color represented by the palette code of 2 will have an error in its blue component when displayed by the pixel because the duty cycle of the pixel drive signal has an error equal to one period of the clock k×CLOCK as a result of the conflict with the color represented by the palette code of 1. However, this error is one-half of that incurred by the conflict resolution procedure described above with reference to FIG. 15. Moreover, higher values of k enable conflicts involving the components of relatively few colors to be resolved with the introduction of relatively small errors. For example, when the value of k is eight, the error introduced in the conflicting component of one of the colors corresponds to an error of only ⅛ of the period of the clock signal k×CLOCK in the pixel drive signal. Finally, the conflict resolution process performed by the digital sequence generator 714 does not introduce additional conflicts that then require resolution.

In clock cycle 28, the output of the modulo-M counter fed to one input of the digital comparator 378 changes to 14, which matches the value of 14 fed from the output of the component value shift register 376 to the other input. This causes the output of the digital comparator to change to its 1 state, as shown in FIG. 17E, which opens the AND gate 799. The clock signal k×CLOCK passes through the AND gate, as shown in FIG. 17F, and clocks the code and component value shift registers 374 and 376.

The clock signal k×CLOCK causes the outputs of the code and component value shift registers 374 and 376 to change. The output of the component value shift register 376 changes from 14 to 0, as shown in FIG. 17C. The output of the code shift register 374 changes from 2 to 3, as shown in FIG. 17D. This new value of the code shift register output is clocked into the digital sequence shift register 784 by the clock signal k×CLOCK, as shown in FIG. 7G.

In clock cycle 29, the output of the modulo-M counter fed to one input of the digital comparator 378 remains at 14. This no longer matches the new value of 0 fed from the output of the component value shift register 376 to the other input. Consequently, the output of the digital comparator reverts to its 0 state, as shown in FIG. 17E, which closes the AND gate 799. This prevents the clock signal k×CLOCK from clocking either of the code and component value shift registers 374 and 376, and their outputs remain unchanged until the end of the digital sequence. In each cycle of the k×CLOCK, the output of the code shift register 374 is clocked into the digital sequence shift register to complete the digital sequence shown in FIG. 17G.

The visibility of the palette changes introduced by the conflict resolution processing described above may be reduced by performing a frame-by-frame reordering of the codes subject to conflicts. This has the effect of temporally dithering the palette changes. For example, if three palette elements a, b and c have identical blue component values 7(*a*), 7(*b*), and 7(*c*), but different red and green component values, these elements could appear in the blue component table in the order a, b, c in one frame, in the order c, b, a in the next frame, and so on. Alternatively, the order of the palette elements having conflicting component values could change randomly from frame-to-frame. Either way, the eye will average out the palette changes introduced by the conflict resolution, and the palette changes will be significantly less discernable.

The invention has been describe with reference to exemplary, highly-simplified embodiments that have various exemplary logic states, signal states, transition directions, color components and numbers of color components. However, the invention encompasses embodiments of any complexity having different logic states, signal states, transition directions, color components and numbers of color components from those illustrated.

Although this disclosure describes illustrative embodiments of the invention in detail, it is to be understood that the invention is not limited to the precise embodiments described, and that various modifications may be practiced within the scope of the invention defined by the appended claims.

We claim:

1. A pixel driver that operates in response to an M-bit digital input value defining the apparent brightness of the pixel, the pixel driver generating a pixel drive signal having a duty cycle that sets the apparent brightness of the pixel, the pixel driver comprising:

a memory that receives and stores an N-bit word representing the digital input value;

a digital sequence generator that generates a digital sequence of P-bit digital values, the digital sequence defining a temporal duration of the pixel drive signal and including a first P-bit word representing at least part of the digital input value at a location temporally corresponding to the duty cycle of the pixel drive signal defined by the at least part of the digital input value; and a comparator connected to receive the digital sequence from the digital sequence generator and a second P-bit word from the memory, the second P-bit word constituting at least part of the N-bit word, the comparator including an output that provides the pixel drive signal and that changes state in response to equality between the first P-bit word and the second P-bit word.

2. The pixel driver of claim 1, in which:

the memory receives and stores the M-bit digital input value as the N-bit word representing the digital input value;

the digital sequence generator generates a sequence of monotonically-changing M-bit digital values as the sequence of P-bit digital values; and the comparator receives the M-bit digital input value from the memory as the second P-bit word and compares the M-bit word with the M-bit digital values constituting the digital sequence.

3. The pixel driver of claim 1, in which:

the M-bit digital input value represents the apparent brightness of the pixel for more than one color component, a first set of P of the M bits defining the apparent brightness of the pixel for a first color component and a second set of P of the M bits defining the apparent brightness of the pixel for a second color component;

the memory receives and stores the M-bit digital input value as the N-bit word representing the digital input value;

the pixel drive signal is a first pixel drive signal, the duty cycle is a first duty cycle that sets the apparent brightness of the pixel at the first color component and the digital sequence is a first digital sequence, and the pixel driver additionally generates a second pixel drive signal having a second duty cycle that sets the apparent brightness of the pixel at the second color component;

the digital sequence generator generates the first digital sequence of P-bit digital values that defines the temporal duration of the first pixel drive signal, the digital values in the first digital sequence including the first set of P of the M bits of the digital input value at a location temporally corresponding to the first duty cycle defined by the first set of P of the M bits of the digital input value, and additionally generates a second digital sequence of P-bit digital values that defines the temporal duration of the second pixel drive signal, the digital values in the second digital sequence including the second set of P of the M bits of the digital input value at a location temporally corresponding to the second duty cycle defined by the second set of P of the M bits of the digital input value; and the pixel driver additionally includes a color selector interposed between the memory and the comparator, the color selector being controlled to select the first set and the second set of P of the M bits stored in the memory as the comparator receives the first digital sequence and the second digital sequence, respectively.

4. The pixel driver of claim 1, in which:

the M-bit digital input value represents the apparent brightness of the pixel for more than one color component, a first set of P of the M bits defining the apparent brightness of the pixel for a first color component and a second set of P of the M bits defining the apparent brightness of the pixel for the second color component;

the memory sequentially receives and stores the first set of P of the M bits of the digital input value and the second set of P of the M bits of the digital input value as the N-bit word representing the digital input value;

the pixel drive signal is a first pixel drive signal, the duty cycle is a first duty cycle that sets the apparent brightness of the pixel for the first color component and the digital sequence is a first digital sequence, and the pixel driver additionally generates a second pixel drive signal having a second duty cycle that sets the apparent brightness of the pixel for the second color component; and the digital sequence generator generates the first digital sequence after the memory receives the first set of P of the M bits of the digital input value, the first digital sequence defining the temporal duration of the first pixel drive signal, the digital values in the first digital sequence including the first set of P of the M bits of the digital input value at a location temporally corresponding to the duty cycle of the first pixel drive signal defined by the first set of P bits and additionally generates the second digital sequence after the memory receives the second set of P of the M bits of the digital input value, the second digital sequence defining the temporal duration of the second pixel drive signal, the digital values in the second digital sequence including the second set of P of the M bits of the digital input value at a location temporally corresponding to the duty cycle of the second pixel drive signal defined by the second set of P bits.

5. The pixel driver of claim 1, in which:

the memory has a bit storage capacity of N bits, less than M bits;

the pixel driver additionally comprises a palette converter that receives the digital input value and provides in response thereto an N-bit palette code that identifies an element of a palette to represent the digital input value, the palette being composed of elements constituting a subset of a range of brightnesses defined by digital input values having M bits, and being defined by a palette code table in which each of the elements is represented by an N-bit palette code and is defined by an M-bit value;

the digital sequence generator receives the palette code table from the palette converter and generates in response thereto a digital sequence that includes the N-bit palette code for each of the elements of the palette at the location temporally corresponding to the duty cycle of the pixel drive signal defined by the respective M-bit value as the first P-bit word; and the memory receives and stores the palette code as the N-bit word representing the digital input value.

6. The pixel driver of claim 5, in which:

the M-bit digital input value represents the apparent brightness of the pixel at one color only; and the palette is composed of elements constituting a subset of the range of apparent brightnesses defined by digital input values having M bits, and is defined by a palette code table in which each of the elements is represented by an N-bit palette code and is defined by an M-bit apparent brightness value.

7. The pixel driver of claim 5, in which:

the digital input value represents the apparent brightness of the pixel for more than one color component, a first set of Q of the M bits defining the apparent brightness of the pixel for a first color component and a second set of Q of the M bits defining the apparent brightness of the pixel for a second color component;

the pixel drive signal is a first pixel drive signal, the duty cycle is a first duty cycle that sets the apparent brightness of the pixel for the first color component and the digital sequence is a first digital sequence, and the pixel drive circuit additionally generates a second pixel drive signal having a second duty cycle that sets the apparent brightness of the pixel for the second color component;

the elements of the palette constitute a subset of a range of colors defined by digital input values having M bits, and the M-bit value defining each of the elements in the palette includes a Q-bit value for each color component;

the digital sequence generator receives the palette code table from the palette converter and, in response thereto, generates the first digital sequence that includes the N-bit palette code for each of the elements of the palette at the location temporally corresponding to the first duty cycle defined by the respective Q-bit value of the first color component and additionally generates a second digital sequence that includes the N-bit palette code for each of the elements of the palette at a location temporally corresponding to the second duty cycle defined by the respective Q-bit value of the second color component; and the comparator receives the N-bit palette code from the memory, and compares the N-bit palette code with the first digital sequence to generate the first pixel drive signal and then compares the N-bit palette code with the second digital sequence to generate the second pixel drive signal.

8. The pixel driver of claim 7, in which the digital sequence generator is structured to operate when elements of the palette have identical Q-bit values for one of the color components to include the N-bit palette code for at least one of the elements at a location in the digital sequence for the one of the color components temporally offset from the location temporally corresponding to the duty cycle defined by the respective Q-bit value of the one of the color components.

9. The pixel driver of claim 8, in which the temporal offset of one of the at least one of the elements whose location is changed is less than $\frac{1}{2}^{Q}$ of the digital sequence.

10. The method of claim 8, in which:

the digital input value constitutes part of a video signal composed of successive frames; and the digital sequence generator is structured to generate the digital sequence for the one of the color components by changing, among the frames of the video signal, the one of the elements whose N-bit palette code is included at the location in the digital sequence temporally offset from the location temporally corresponding to the duty cycle defined by the respective Q-bit value changes.

11. The pixel driver of claim 5, in which:

the M-bit digital input value represents the apparent brightness of the pixel for more than one color component, a first set of Q of the M bits defining the apparent brightness of the pixel for a first color component and a second set of Q of the M bits defining the apparent brightness of the pixel for a second color component;

the pixel drive signal is a first pixel drive signal, the duty cycle is a first duty cycle that sets the apparent brightness of the pixel at the first color component, and the digital sequence is a first digital sequence, and the pixel driver additionally generates a second pixel drive signal having a second duty cycle that determines the apparent brightness of the pixel at the second color component;

the palette includes, for each color component, a component palette composed of elements constituting a subset of a range of brightnesses defined by sets having Q bits, the component palette being defined by a component table in which the elements is represented by an N-bit palette code and is defined by a Q-bit value for the color component;

the palette converter sequentially receives the first set of Q and the second set of Q of the M bits of the digital input value and provides in response to the first set of Q bits a first N-bit palette code that identifies an element of the component palette for the first color component and provides in response to the second set of Q bits a second N-bit palette code that identifies an element of the component palette for the second color component;

the memory sequentially stores the first and second N-bit palette codes;

the digital sequence generator receives each component table from the palette converter and, in response to the component table for the first color component, generates the first digital sequence that includes the N-bit palette code for each of the elements of the component palette for the first color component at the location temporally corresponding to the first duty cycle defined by the respective Q-bit value of the first color component and, in response to the component table for the second color component, additionally generates a second digital sequence that includes the N-bit palette code for each of the elements of the second palette at a location temporally corresponding to the second duty cycle defined by the respective Q-bit value of the second color component; and the comparator compares receives the first N-bit palette code from the memory and compares the first N-bit palette code with the first digital sequence to generate the first pixel drive signal and then receives the second N-bit palette code from the memory and compares the second N-bit palette code with the second digital sequence to generate the second pixel drive signal.

12. The pixel driver of claim 1, in which:

the pixel driver generates the pixel drive signal as a first pixel drive signal and additionally generates a second pixel drive signal to restore DC balance of the pixel, the duty cycle of the first pixel drive signal being a first duty cycle;

the digital sequence generator generates the digital sequence as a first digital sequence, and additionally generates a second digital sequence identical to the first digital sequence; and the comparator compares the second P-bit word with the first digital sequence in a first sense to generate the first pixel drive signal, and additionally compares the second P-bit word with the second digital sequence in a second sense, opposite to the first sense, to generate the second pixel drive signal with a second duty cycle, complementary to the first duty cycle.

13. The pixel driver of claim 1, in which:

the pixel driver generates the pixel drive signal as a first pixel drive signal and additionally generates a second pixel drive signal to restore DC balance of the pixel, the duty cycle of the first pixel drive signal being a first duty cycle;

the digital sequence generator generates the digital sequence as a first digital sequence, and additionally generates a second digital sequence opposite in order to the first digital sequence; and the comparator compares the second P-bit word with the first digital sequence to generate the first pixel drive signal, and additionally compares the second P-bit word with the second digital sequence to generate the second pixel drive signal with a second duty cycle, complementary to the first duty cycle.

14. The pixel driver of claim 1, in which:

the memory includes dynamic memory elements; and the pixel driver additionally comprises a refresh path that operates in response to the state of the pixel drive signal changing to store the first P-bit word in the memory to replace at the least part of the N-bit word.

15. A method for generating a pixel drive signal for a pixel in response to an M-bit digital input value defining the apparent brightness of the pixel, the drive signal having a duty cycle that sets the apparent brightness of the pixel, the method comprising:

receiving and storing an N-bit word representing the digital input value;

generating a digital sequence composed of P-bit digital values, the digital sequence defining a temporal duration of the pixel drive signal, and including a first P-bit word representing at least part of the digital input value at a location temporally corresponding to the duty cycle of the pixel drive signal defined by the at least part of the digital input value; and comparing a second P-bit word constituting at least part of the stored N-bit word with the digital sequence to generate the pixel drive signal, the pixel drive signal changing state in response to equality between the second P-bit word and the first P-bit word.

16. The method of claim 15, in which:

in receiving and storing the N-bit word representing the digital input value, the M-bit digital input value is received and stored;

in generating the digital sequence, a monotonically-changing sequence of M-bit digital values is generated as the sequence of P-bit digital values; and in comparing the second P-bit word with the digital sequence, the M-bit digital input value is compared with the M-bit digital values constituting the digital sequence.

17. The method of claim 15, in which:

the M-bit digital input value represents the apparent brightness of the pixel for more than one color component, a first set of P of the M bits defining the apparent brightness of the pixel for a first color component and a second set of P of the M bits defining the apparent brightness of the pixel for a second color component;

in receiving and storing the N-bit word representing the digital input value, the M-bit digital input value is received and stored as the N-bit word;

the pixel drive signal is a first pixel drive signal, the duty cycle is a first duty cycle that sets the apparent brightness of the pixel for the first color component, and the digital sequence is a first digital sequence, and the method additionally generates a second pixel drive signal having a duty cycle that sets the apparent brightness of the pixel for the second color component;

in generating the digital sequence, the first digital sequence is generated, the first digital sequence defining the temporal duration of the first pixel drive signal and including the first set of P of the M bits of the digital input value at the location temporally corresponding to the first duty cycle set by the first set of P bits;

the method additionally comprises generating a second digital sequence that defines a temporal duration of the second pixel drive signal, the second digital sequence including the second set of P of the M bits of the digital input value at a location temporally corresponding to the second duty cycle set by the second set of P bits;

comparing the second P-bit word constituting at least part of the stored N-bit word with the digital sequence to generate the pixel drive signal includes:

selecting the first set of P bits from the M bits of the stored digital input value, and comparing the first set of P bits selected from the M bits of the stored digital input value with the first digital sequence to generate the first pixel drive signal; and the method additionally includes:

selecting the second set of P bits from the M bits of the stored digital input value, and comparing the second set of P bits selected from the M bits of the stored digital input value with the second digital sequence to generate the second pixel drive signal.

18. The method of claim 15, in which:

the M-bit digital input value represents the apparent brightness of the pixel for more than one color component, a first set of P of the M bits defining the apparent brightness of the pixel for a first color component and a second set of P of the M bits defining the apparent brightness of the pixel for a second color component;

in receiving and storing the N-bit word representing the digital input value, the first set of P of the M bits of the digital input value and the second set of P of the M bits of the digital input value are sequentially received and stored as the N-bit word representing the digital input value;

the pixel drive signal is a first pixel drive signal, the duty cycle is a first duty cycle that sets the apparent brightness of the pixel for the first color component and the digital sequence is a first digital sequence, and the method additionally generates a second pixel drive signal having a second duty cycle that sets the apparent brightness of the pixel for the second color component; and in generating the digital sequence, the first digital sequence is generated after the first set of P of the M bits of the digital input value is stored, the first digital sequence defining the temporal duration of the first pixel drive signal, and including the first set of P bits at a location temporally corresponding to the duty cycle of the first pixel drive signal defined by the first set of P bits;

the method additionally comprises generating a second digital sequence after the second set of P of the M bits of the digital input value is stored, the second digital sequence defining the temporal duration of the second pixel drive signal, and including the second set of P bits at a location temporally corresponding to the duty cycle of the second pixel drive signal defined by the second set of P bits; and in comparing the second P-bit word constituting at least part of the stored N-bit word with the digital sequence to generate the pixel drive signal, the first set of P of the M bits of the digital input value are compared with the first digital sequence to generate the first pixel drive signal; and the method additionally comprises comparing the second set of P of the M bits of the digital input value with the second digital sequence to generate the second pixel drive signal.

19. The method of claim 15, in which:

the method additionally comprises providing in response to the M-bit digital input value an N-bit palette code that identifies an element of a palette to represent the digital input value, the palette being composed of elements constituting a subset of a range of brightnesses defined by digital input values having M bits, and being defined by a palette code table in which each of the elements is represented by an N-bit palette code and is defined by an M-bit value;

generating the digital sequence includes receiving the palette code table and generating the digital sequence in response thereto, the digital sequence including the N-bit palette code for each of the elements of the palette at the location temporally corresponding to the duty cycle of the pixel drive signal defined by the respective M-bit value as the first P-bit word; and in receiving and storing an N-bit word representing the digital input value, the N-bit palette code is received and stored.

20. The method of claim 19, in which:

the M-bit digital input value represents the apparent brightness of the pixel for one color only; and the palette is composed of elements constituting a subset of the range of apparent brightnesses defined by digital input values having M bits, and is defined by a palette code table in which each of the elements is represented by an N-bit palette code and is defined by an M-bit apparent brightness value.

21. The method of claim 19, in which:

the digital input value represents the apparent brightness of the pixel for more than one color component, a first set of Q of the M bits defining the apparent brightness of the pixel for a first color component and a second set of Q of the M bits defining the apparent brightness of the pixel for a second color component;

the pixel drive signal is a first pixel drive signal, the duty cycle is a first duty cycle that determines the apparent brightness of the pixel at the first color component, and the method additionally generates a second pixel drive signal that determines the apparent brightness of the pixel at the second color component;

in providing an N-bit palette code in response to the M-bit digital input value, the elements of the palette constitute a subset of a range of colors defined by digital input values having M bits, and the M-bit value defining each of the elements in the palette includes a Q-bit value for each color component;

in generating the digital sequence, the first digital sequence is generated in response to the palette code table, the first digital sequence including the N-bit palette code for each of the elements of the palette at the location temporally corresponding to the first duty cycle defined by the respective Q-bit value of the first color component;

the method additionally comprises generating the second digital sequence in response to the palette code table, the second digital sequence defining the N-bit palette code for each of the elements of the palette at the location temporally corresponding to the second duty cycle defined by the respective Q-bit value of the second color component;

in comparing the second P-bit word with the digital sequence, the N-bit palette code is compared with the first digital sequence to generate the first pixel drive signal; and the method additionally comprises comparing the N-bit palette code with the second digital sequence to generate the second pixel drive signal.

22. The method of claim 21, in which, when elements of the palette have identical Q-bit values for one of the color components, in generating the one of the digital sequences corresponding to the one of the color components, the N-bit palette code for at least one of the elements is included at a location temporally offset from the location temporally corresponding to the duty cycle defined by the respective Q-bit value of the one of the color components.

23. The method of claim 22, in which, in generating the one of the digital sequences corresponding to the one of the color components, the N-bit palette code for one of the at least one of the elements is included at a location temporally offset from the location temporally corresponding to the duty cycle defined by the respective Q-bit value of the one of the color components by an amount temporally corresponding to less than $\frac{1}{2}^{Q}$ of the digital sequence.

24. The method of claim 22, in which:

the digital input value constitutes part of a video signal composed of successive frames; and in generating the one of the digital sequences corresponding to the one of the color components, the one of the elements whose N-bit palette code is included at the location temporally offset from the location temporally corresponding to the duty cycle defined by the respective Q-bit value changes among the frames of the video signal.

25. The pixel driver of claim 19, in which:

the M-bit digital input value represents the apparent brightness of the pixel for more than one color component, a first set of Q of the M bits defining the apparent brightness of the pixel for a first color component and a second set of Q of the M bits defining the apparent brightness of the pixel for a second color component;

the N-bit palette code is a first N-bit palette code, the pixel drive signal is a first pixel drive signal, the duty cycle is a first duty cycle that determines the apparent brightness of the pixel for a first color component, and the method additionally generates a second pixel drive signal that determines the apparent brightness of the pixel for a second color component;

in providing an N-bit palette code in response to the M-bit digital input value, the palette includes, for each color component, a component palette composed of elements constituting a subset of a range of brightnesses defined by sets having Q bits, the component palette being defined by a component table in which the elements is represented by an N-bit palette code and is defined by a Q-bit value for the color component;

providing an N-bit palette code in response to the M-bit digital input value includes:

providing the first N-bit palette code in response to the first set of Q of the M bits of the digital input value, the first N-bit palette code identifying an element of the component palette for the first color component, and providing, in response to the second set of Q bits, a second N-bit palette code that identifies an element of the component palette for the second color component;

in receiving and storing an N-bit word representing the digital input value, the first and second N-bit palette codes are sequentially received and stored;

in generating the digital sequence, the first digital sequence is generated in response to the component table for the first color component and includes the N-bit palette code for each of the elements of the component palette for the first color component at the location temporally corresponding to the first duty cycle defined by the respective Q-bit value of the first color component;

the method additionally comprises generating the second digital sequence in response to the component table for the second color component, the second digital sequence defining the temporal duration of the second pixel drive signal and including the N-bit palette code for each of the elements of the component palette for the second color component at the location temporally corresponding to the second duty cycle defined by the respective Q-bit value of the second color component; and in comparing the second P-bit word with the digital sequence, the first N-bit palette code is compared with the first digital sequence to generate the first pixel drive signal; and the method additionally comprises comparing the second N-bit palette code with the second digital sequence to generate the second pixel drive signal.

26. The method of claim 15, in which:

the method is for generating the pixel drive signal as a first pixel drive signal and is additionally for generating a second pixel drive signal to restore DC balance of the pixel;

the digital sequence is a first digital sequence and the duty cycle of the first pixel drive signal is a first duty cycle;

in comparing the second P-bit word constituting at least part of the stored N-bit word with the digital sequence to generate the pixel drive signal, the second P-bit word is compared in a first sense with the first digital sequence to generate the first pixel drive signal;

the method additionally comprises:

generating a second digital sequence identical to the first digital sequence, and comparing the second P-bit word with the second digital sequence in a second sense, opposite to the first sense to generate the second pixel drive signal with a second duty cycle, complementary to the first duty cycle.

27. The method of claim 15, in which:

the method is for generating the pixel drive signal as a first pixel drive signal and is additionally for generating a second pixel drive signal to restore DC balance of the pixel;

the digital sequence is a first digital sequence and the duty cycle of the first pixel drive signal is a first duty cycle;

in comparing the second P-bit word constituting at least part of the stored N-bit word with the digital sequence to generate the pixel drive signal, the second P-bit word is compared with the first digital sequence to generate the first pixel drive signal;

the method additionally comprises:

generating a second digital sequence opposite in temporal order to the first digital sequence, and comparing the second P-bit word with the second digital sequence to generate the second pixel drive signal with a second duty cycle, complementary to the first duty cycle.

28. The method of claim 15, in which the method additionally comprises storing the first P-bit word to replace at the least part of the N-bit word in response to the state of the pixel drive signal changing.

* * * * *